(12) United States Patent
Goto

(10) Patent No.: US 12,745,417 B2
(45) Date of Patent: Sep. 22, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yotaro Goto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 627 days.

(21) Appl. No.: 18/191,486

(22) Filed: Mar. 28, 2023

(65) Prior Publication Data

US 2023/0387294 A1 Nov. 30, 2023

(30) Foreign Application Priority Data

May 25, 2022 (JP) ................................ 2022-085271

(51) Int. Cl.

*H01L 29/78* (2006.01)
*H10D 30/01* (2025.01)
*H10D 30/65* (2025.01)

(52) U.S. Cl.

CPC ......... *H10D 30/65* (2025.01); *H10D 30/0285* (2025.01)

(58) Field of Classification Search

CPC ............... H10D 30/65; H10D 30/0285; H10D 30/0221; H10D 30/603; H10D 64/518; H10D 62/153; H10D 62/393; H10D 64/256; H10D 62/124; H10D 62/154; H10D 62/155; H10D 64/512; H10D 84/013; H10D 84/0135; H10D 84/0144; H10D 84/038; H10D 84/83

See application file for complete search history.

(56) References Cited

U.S. PATENT DOCUMENTS

2021/0376097 A1 12/2021 Goto et al.
2022/0271157 A1 * 8/2022 Feng ................. H10D 30/0212

FOREIGN PATENT DOCUMENTS

JP 2010-027695 A 2/2010
JP 2011-165818 A 8/2011
JP 2021-190548 A 12/2021

OTHER PUBLICATIONS

Machine English translation of JP 2010-027695 A, Noma Seiji et al. (Year: 2010).*

Office Action dated May 7, 2025, from corresponding Japan Application No. 2022-085271, 7 pages.

* cited by examiner

*Primary Examiner* — Mohammed R Alam

(74) *Attorney, Agent, or Firm* — RIMON P.C.

(57) ABSTRACT

In a semiconductor substrate, an n-type source region, an n-type drain region, a first p-type semiconductor region, and a second p-type semiconductor region surrounding the n-type source region and the first p-type semiconductor region are formed. A gate electrode is formed on the semiconductor substrate between the n-type source region and the n-type drain region via a dielectric film GF. In the semiconductor substrate, a recessed portion is formed so as to penetrate through the n-type source region, and the first p-type semiconductor region is formed under the recessed portion.

14 Claims, 19 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2022-085271 filed on May 25, 2022, including the specification, drawings and abstract is incorporated herein by reference in its entirety.

BACKGROUND

The present disclosure relates to a semiconductor device and a method of manufacturing the same, and can be suitably used, for example, for a semiconductor device having an LDMOSFET and a method of manufacturing the same.

As a MISFET (Metal Insulator Semiconductor Field Effect Transistor), there is an LDMOSFET (Laterally Diffused Metal-Oxide-Semiconductor Field Effect Transistor). The LDMOSFET has a high drain breakdown voltage.

There are disclosed techniques listed below.

[Patent Document 1] Japanese Unexamined Patent Application Publication No. 2021-190548

Patent Document 1 describes a technique relating to a semiconductor device having an LDMOSFET.

SUMMARY

In a semiconductor device having a MISFET, it is desired to improve performance as much as possible.

Other objects and novel features will become apparent from the description of this specification and the accompanying drawings.

According to one embodiment, a semiconductor device includes a semiconductor substrate, a source region of a first conductivity type and a drain region of the first conductivity type which are formed spaced apart from each other in the semiconductor substrate, a gate electrode formed on the semiconductor substrate between the source region and the drain region via a gate dielectric film, and a recessed portion formed in the semiconductor substrate so as to penetrate through the source region. The semiconductor device further includes a first semiconductor region of a second conductivity type provided under the recessed portion, and a second semiconductor region of the second conductivity type formed so as to surround the source region and the first semiconductor region.

According to one embodiment, a manufacturing method of a semiconductor device includes: (a) preparing a semiconductor substrate; (b) forming a conductive film for a gate electrode on the semiconductor substrate via a gate dielectric film; and (c) after the (b), etching the conductive film to form a first pattern formed of the conductive film and expose a first upper surface of the semiconductor substrate. The manufacturing method of the semiconductor device further includes: (d) after the (c), forming a source region of a first conductivity type in the first upper surface by an ion implantation method; (e) after the (d), etching the first upper surface to form a recessed portion so as to penetrate through the source region; and (f) after the (e), forming a first semiconductor region of a second conductivity type under the recessed portion in the semiconductor substrate by an ion implantation method.

According to one embodiment, the performance of the semiconductor device can be improved.

DETAILED DESCRIPTION

Figure 1:
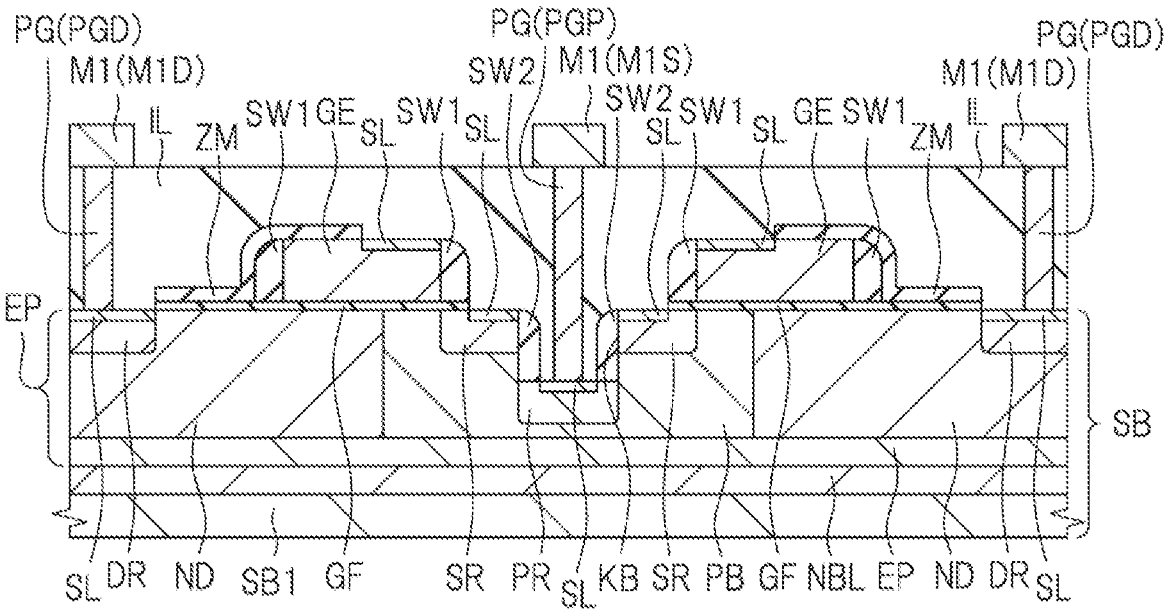
FIG. 1 is a cross-sectional view of a main portion of a semiconductor device according to one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

First Embodiment

Structure of Semiconductor Device

Figure 2:
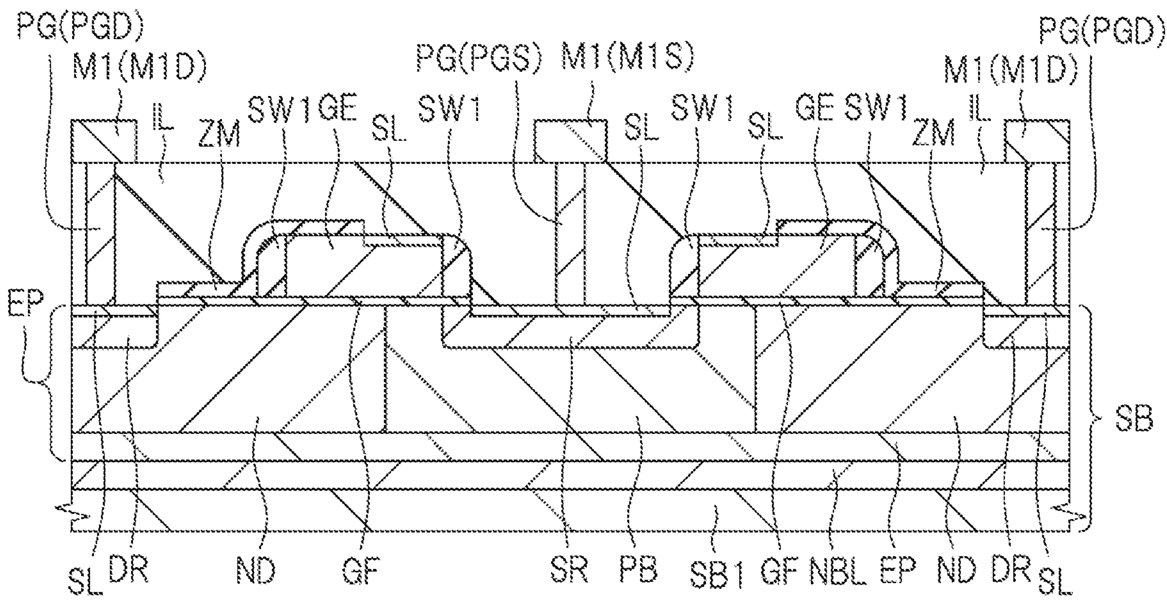
FIG. 2 is a cross-sectional view of the main portion of the semiconductor device according to one embodiment.
Figure 3:
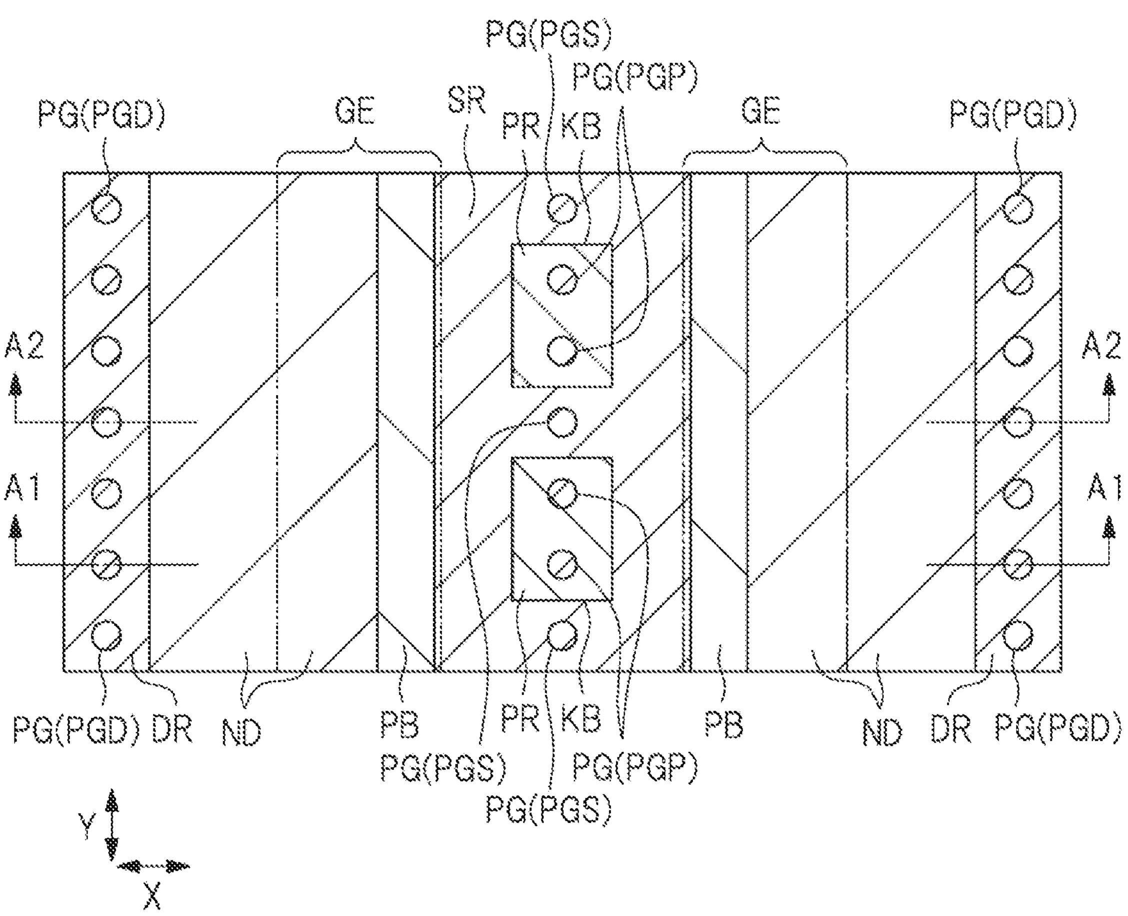
FIG. 3 is a plan view of the main portion of the semiconductor device according to one embodiment.

A semiconductor device according to the first embodiment of the present disclosure will be described referring to the drawings. FIG. 1 and FIG. 2 are cross-sectional views of the main portions of the semiconductor device according to the present embodiment, and FIG. 3 is a plan view of the main portion of the semiconductor device according to the present embodiment. In FIGS. 1 and 2, cross sections substantially parallel to a gate length direction are shown, a cross-sectional view along A1-A1 line in FIG. 3 substantially corresponds to FIG. 1, and a cross-sectional view along A2-A2 line in FIG. 3 substantially corresponds to FIG. 2. In FIG. 1 to FIG. 3, two LDMOSFETs sharing an n-type source region SR and a p-type semiconductor region PR.

In addition, in FIG. 3, an X direction and a Y direction are shown. The X direction is along a gate length direction of a gate electrode GE, and is along a channel length direction. The Y direction is a gate width direction of the gate electrode GE. The Y direction intersects with the X direction, and more specifically, is orthogonal to the X direction. In the following description, the gate length direction of the gate electrode GE is simply referred to as the "gate length direction", and the gate width direction of the gate electrode GE is simply referred to as the "gate width direction".

The semiconductor device of the present embodiment has a MISFET (Metal Insulator Semiconductor Field Effect Transistor), and has an LDMOSFET (Laterally Diffused Metal-Oxide-Semiconductor Field Effect Transistor) as the MISFET.

In the present application, the MOSFET (Metal Oxide Semiconductor Field Effect Transistor) or the LDMOSFET are not only the MISFET using an oxide film (silicon oxide film) as a gate dielectric film but also the MISFET using a dielectric film other than the oxide film (silicon oxide film) as the gate dielectric film. The LDMOSFET is a kind of MISFET device.

Hereinafter, a structure of the semiconductor device of the present embodiment will be described in detail referring to FIGS. 1 to 3.

As shown in FIGS. 1 to 3, as the MISFET, the LDMOSFET is formed on a main surface of a semiconductor substrate SB. The semiconductor substrate SB includes, for example, a substrate main body SB1 which is a semiconductor substrate made of p-type monocrystalline silicon into which p-type impurities such as boron (B) are implanted, an n-type buried layer (semiconductor layer) NBL formed on the substrate main body SB1, and an epitaxial layer (semiconductor layer) EP made of p-type monocrystalline silicon or the like and formed on the buried layer NBL. For this reason, the semiconductor substrate SB is a so-called epitaxial wafer. An impurity concentration (p-type impurity concentration) of the substrate main body SB1 is higher than an impurity concentration (p-type impurity concentration) of the epitaxial layer EP. The epitaxial layer EP and the buried layer NBL can also be considered part of the semiconductor substrate SB.

An element isolation region (not shown) made of an insulator (dielectric film) is formed on the main surface of the semiconductor substrate SB by, for example, STI (Shallow Trench Isolation) method or LOCOS (Local Oxidization of Silicon) method.

FIGS. 1 and 2 are referred to. An n-type semiconductor region (n-type drift layer, n-type well) ND and a p-type semiconductor region (p-type body region, p-type well) PB are formed in an upper portion (upper layer portion) of the semiconductor substrate SB, that is, in an upper portion (upper layer portion) of the epitaxial layer EP. The n-type semiconductor region ND is an n-type semiconductor region.

P-type Semiconductor Region PB

The p-type semiconductor region PB is a p-type semiconductor region. The n-type semiconductor region ND and the p-type semiconductor region PB are adjacent to each other. An impurity concentration (p-type impurity concentration) of the p-type body region PB is higher than the impurity concentration (p-type impurity concentration) of the epitaxial layer EP. The p-type semiconductor region PB is formed so as to surround the n-type source region SR and the p-type semiconductor region PR, which will be described later. More specifically, the p-type semiconductor region PB is in contact with a bottom surface and a side surface of the p-type semiconductor region PR. Further, the p-type semiconductor region PB is in contact with a bottom surface of the n-type source region SR and a side surface of the n-type source region SR opposite to a side of the recessed portion KB described later.

The p-type semiconductor region PB can function as a back gate. The p-type semiconductor region PB can also function as a punch-through stopper that suppresses the extension of the depletion layer from the drain to the source of LDMOSFET. Between the n-type source region SR and the n-type drain region DR, an upper portion (upper layer portion) of the p-type semiconductor region PB located under the gate electrode GE serves as a channel forming region of the LDMOSFET.

N-Type Source Region SR

The n-type source region (n-type semiconductor region) SR is formed in the p-type semiconductor region PB. The n-type source region SR functions as a source region of the LDMOSFET. The n-type source region SR is adjacent to the recessed portion KB, which will be described later. In the present embodiment, referring to FIG. 1, the n-type source region SR is arranged on the left and right sides of the recessed portion KB in a cross-section. Therefore, one of the side surfaces of the n-type source region SR is in contact with the recessed portion KB. The n-type source PR is formed in the semiconductor substrate SB. The n-type source region PR has an upper surface that is the same height as an upper surface of the semiconductor substrate SB.

Recessed Portion KB

The recessed portion KB is formed on the main surface (upper surface) of the semiconductor substrate SB, that is, on the main surface (upper surface) of the epitaxial layer EP. The recessed portion KB has a concave shape in a thickness direction of the semiconductor substrate SB. The recessed portion KB is formed by a space that penetrates through the inside of the n-type source region SR from the upper surface to the lower surface of the n-type source region SR. In FIG. 1, the recessed portion KB penetrates through the center of the n-type source region SR. The recessed portion KB further forms a space that reaches the p-type semiconductor region PB below the n-type source region SR.

Here, FIG. 3 is referred to. In plan view, the recessed portion KB is included in the n-type source region SR. That is, in plan view, the recessed portion KB is surrounded by the n-type source region SR. The n-type source region SR is in contact with the recessed portion KB so as to surround the recessed portion KB. As shown in FIG. 1, one side surface of the n-type source region SR, that is, a side surface opposite to the side surface adjacent to the recessed portion KB, and the bottom surface of the n-type source region SR are covered with the p-type semiconductor region PB.

P-Type Semiconductor Region PR

The p-type semiconductor region PR is also formed in the p-type semiconductor region PB. The p-type semiconductor region PR is formed under the bottom (bottom surface) of the recessed portion KB. An impurity concentration (p-type impurity concentration) of the p-type semiconductor region PR is higher than the impurity concentration (p-type impurity concentration) of the p-type semiconductor region PB. The side surface and the bottom surface of the p-type semiconductor region PR are in contact with the p-type semiconductor region PB. The p-type semiconductor region PR is covered with the p-type semiconductor region PB except for the upper surface thereof. Therefore, the p-type semiconductor region PB is formed so as to surround the p-type semiconductor region PR together with the n-type source region SR. The p-type semiconductor region PR can function as a contact of the p-type semiconductor region PB.

Figure 11:
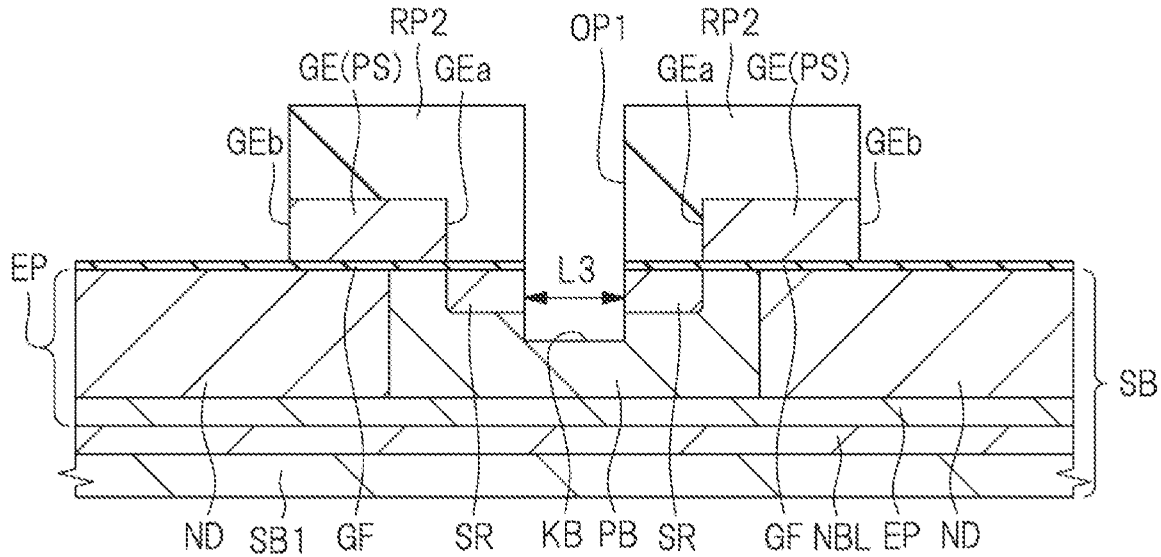
FIG. 11 is a cross-sectional view of the main portion during the manufacturing process of the semiconductor device following FIG. 10.
Figure 32:
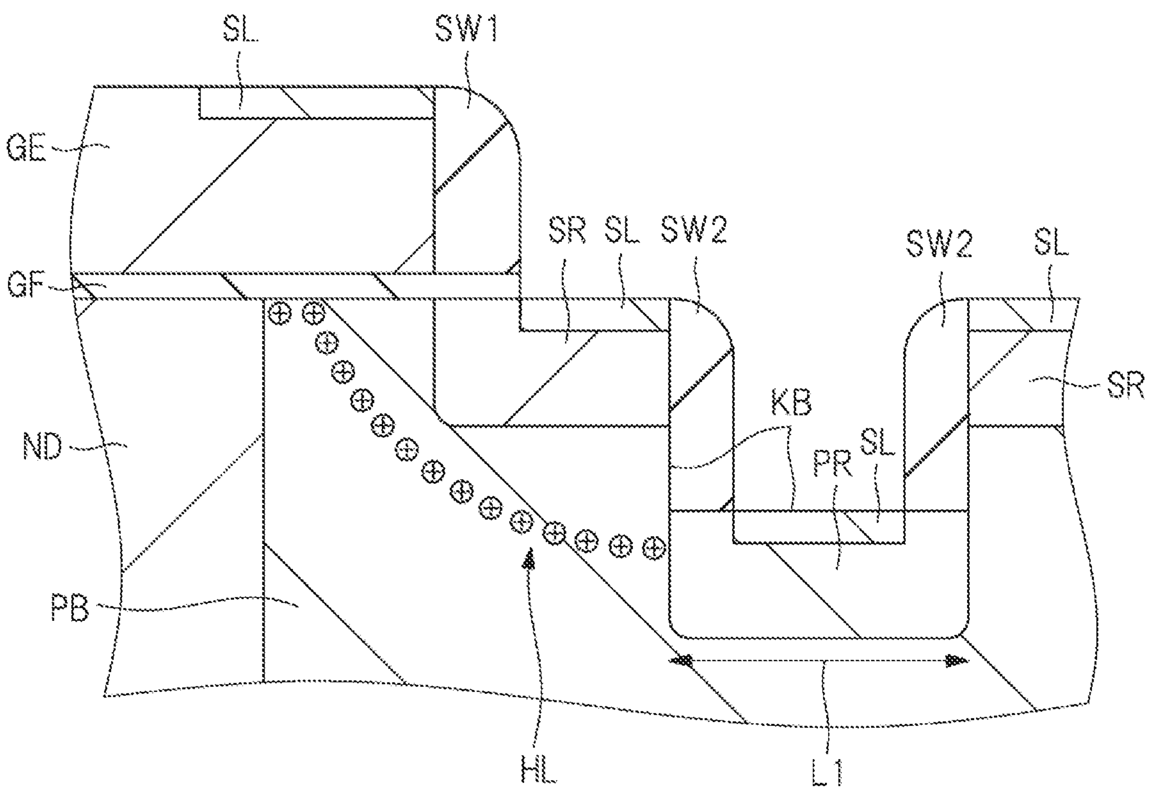
FIG. 32 is a cross-sectional view of the main portion of the semiconductor device according to one embodiment.

In the present embodiment, the upper surface of the p-type semiconductor region PR is located below the bottom surface of the n-type source region SR. In other words, the height position of the upper surface of the p-type semiconductor region PR is lower than the height position of the bottom surface of the n-type source region SR. The side surface of the p-type semiconductor region PR is in the same plane as the side surface of the recessed portion KB. Similarly, the side surface of the p-type semiconductor region PR is in the same plane as the side surface of the n-type source region SR. A length of the p-type semiconductor region PR in the gate length direction is the same as a length of the recessed portion KB. Referring also to FIG. 32, the length of the p-type semiconductor region PR is indicated as the width L1. Referring also to FIG. 11, the length of the recessed portion KB is indicated as the width L3.

Figure 4:
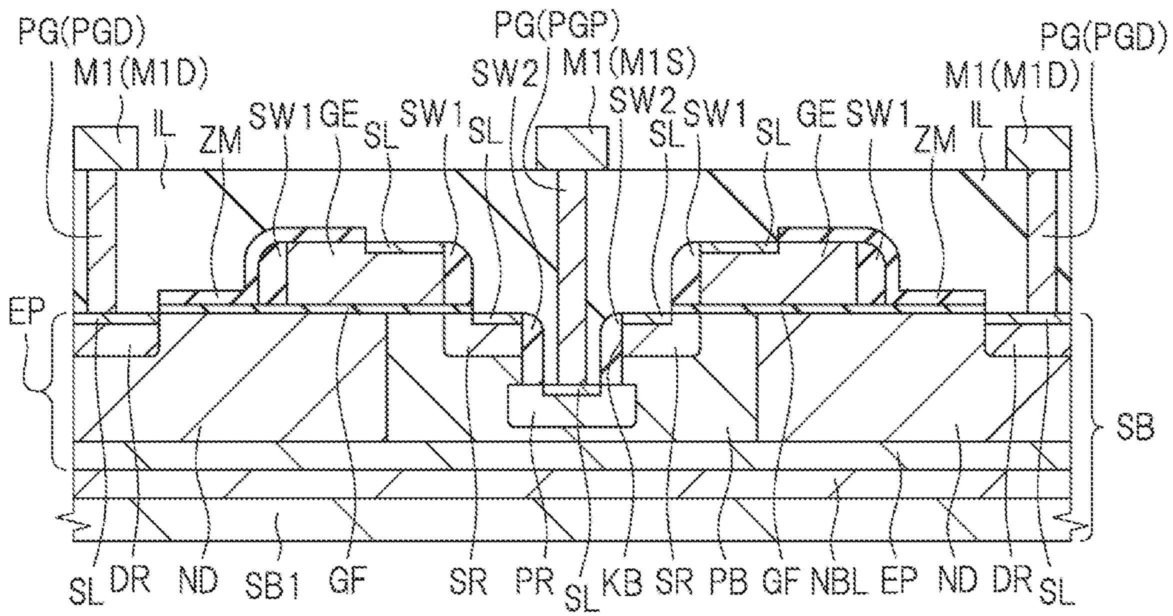
FIG. 4 is a cross-sectional view of a main portion of a semiconductor device of according to a modified example.

As a modified example, as shown in FIG. 4, the length of the p-type semiconductor region PR may be larger than the length of the recessed portion KB. As a result, the contact region between the p-type semiconductor region PR and the p-type semiconductor region PB can be widened. Here, FIG. 4 is a cross-sectional view of the main portion showing the modified example of the semiconductor device according to the present embodiment, and shows a cross section corresponding to FIG. 1. FIG. 4 shows a case where the length of the p-type semiconductor region PR in the gate length direction is larger than the length of the recessed portion KB in the gate length direction.

Further, in FIG. 3, the p-type semiconductor region PR is arranged in an island shape in the p-type semiconductor region PB in plan view. The p-type semiconductor region PR can be arranged in islands in the p-type semiconductor region PB.

N-Type Semiconductor Region ND

FIG. 1 is referred to again. In the gate length direction (X direction), the n-type semiconductor region ND is adjacent to the p-type semiconductor region PB. Of the n-type semiconductor region ND and the p-type semiconductor region PB, the n-type semiconductor region ND is located on the drain-side and the p-type semiconductor region PB is located on the source-side. The boundary between the n-type semiconductor region ND and the p-type semiconductor region PB is located under the gate electrode GE and extends in the gate width direction (Y direction) of the gate electrode GE.

N-type Drain Region DR

The n-type drain region (n-type semiconductor region) DR is formed in the n-type semiconductor region ND. The n-type semiconductor region ND is formed so as to surround the n-type drain region DR. In other words, the bottom surface of the n-type drain region DR and the side surface of the n-type drain region DR are covered with the n-type semiconductor region ND. The n-type drain region DR functions as a drain region of the LDMOSFET. An impurity concentration (n-type impurity concentration) of the n-type drain region DR is higher than the impurity concentration (n-type impurity concentration) of the n-type semiconductor region ND. The n-type drain region DR and the n-type source region SR are spaced apart from each other in the gate length direction (X direction) of the gate electrode GE.

In the gate length direction (X direction) of the gate electrode GE, the n-type semiconductor region ND having an impurity concentration (n-type impurity concentration) lower than that of the n-type drain region DR is interposed between the p-type semiconductor region PB and the n-type drain region DR. Therefore, the n-type semiconductor region ND having an impurity concentration lower than that of the n-type drain region DR is present between the channel forming region of LDMOSFET and the n-type drain region DR, and the n-type semiconductor region ND can function as an n-type drift region. Therefore, in the gate length direction (X direction) of the gate electrode GE, the channel forming region and the n-type semiconductor region ND (n-type drift region) is present between the n-type source region SR and the n-type drain region DR, the channel forming region is located on a side of the n-type source region SR, and the n-type semiconductor region ND is located on a side of the n-type drain region DR. The channel forming region is adjacent to the n-type source region SR and the n-type semiconductor region ND, and is interposed between the n-type source region SR and the n-type semiconductor region ND in the X direction. The n-type semiconductor region ND and the p-type epitaxial layer EP remaining below the p-type semiconductor region PB can function as a resurf layer (resurf region). In the present embodiment, the epitaxial layer is used, but the present invention is not limited thereto, and a layer formed by ion implantation may be used.

Gate Electrode GE

The gate electrode GE of the LDMOSFET is formed on the main surface (upper surface) of the semiconductor substrate SB, that is, on the main surface (upper surface) of the epitaxial layer EP, via a dielectric film (gate dielectric film) GF. In the epitaxial layer EP of the semiconductor substrate SB, the n-type source region SR and the n-type drain region DR are formed. The gate electrode GE is formed on the epitaxial layer EP between the n-type source region SR and the n-type drain region DR via the dielectric film GF. The dielectric film GF is a gate dielectric film of the LDMOSFET. Note that the width of the n-type source region SR is the same width as the gate width of the gate electrode GE. That is, in the Y direction, the width of the source region SR and the width of the gate electrode GE are the same.

The gate electrode GE is formed of, for example, a single film of a polycrystalline silicon film (doped polysilicon film) or a stacked film of a polycrystalline silicon film and a metal silicide layer. The dielectric film GF is made of, for example, a silicon oxide film. Sidewall spacers (sidewall dielectric films) SW1 made of a dielectric film (for example, a silicon oxide film) are formed on both side surfaces (sidewalls) of the gate electrode GE.

The gate electrode GE is arranged between the n-type source region SR and the n-type drain region DR. When a voltage equal to or higher than the threshold voltage is applied to the gate electrode GE, an n-type inversion layer is formed in an upper portion (upper layer portion) on the p-type semiconductor regions PB located under the gate electrode GE. The n-type inversion layer serves as a channel. The n-type source region SR and the n-type drain region DR conduct via the channel and the n-type semiconductor region ND.

A part of the p-type semiconductor region PB is located under the gate electrode GE, and a part of the n-type semiconductor region ND is located under the gate electrode GE. A boundary between the p-type semiconductor region PB and the n-type semiconductor region ND constitutes a PN junction surface. This boundary is located under the middle of the gate electrode GE in the X direction.

Sidewall Dielectric Film SW2

Sidewall dielectric films SW2 made of a dielectric film is formed on side surfaces of the recessed portion KB. For example, the sidewall dielectric films SW2 are made of a silicon oxide film. The sidewall dielectric films SW2 have a sidewall spacer shape. Referring to FIG. 1, the sidewall dielectric films SW2 are provided so as to cover the side surfaces of the recessed portion KB from the height of the position of the metal silicide SL on the n-type source region SR to the bottom of the recessed portion KB, that is, to the upper surface of the first semiconductor region PR in the thickness direction (height direction in the drawing) of the semiconductor. The sidewall dielectric films SW2 cover the n-type source region SR and the second semiconductor region PB facing the recessed portion KB.

Metal Silicide Layer SL

The metal silicide layer SL is formed on the upper portion (upper layer portion) of each of the n-type drain region DR, the n-type source region SR, the p-type semiconductor region PR, and the gate electrode GE. The metal silicide layer SL is formed of, for example, a cobalt silicide layer, a nickel silicide layer, a platinum-doped nickel silicide layer, or the like, and can be formed using a Salicide (Self Aligned Silicide) technique. The metal silicide layer SL is preferably formed, but may be omitted if not necessary.

Interlayer Dielectric Layer IL

The interlayer dielectric film IL is formed as a dielectric film on the main surface (upper surface) of the semiconductor substrate SB, that is, on the main surface (upper surface) of the epitaxial layer EP so as to cover the gate electrode GE and the sidewall spacers SW1. The interlayer dielectric film IL is formed of, for example, a silicon oxide film. The interlayer dielectric film IL can also be formed by a stacked film of a relatively thin silicon nitride film and a relatively thick silicon oxide film on the silicon nitride. An upper surface of the interlayer dielectric film IL is planarized. The interlayer dielectric film IL is also formed in the recessed portion KB. That is, the interlayer dielectric film IL is formed on the main surface of the semiconductor substrate SB (epitaxial layer EP) so as to cover the gate electrode GE and the sidewall spacers SW1 and to fill the inside of the recessed portion KB.

A contact hole (through-hole) is formed in the interlayer dielectric film IL, and a conductive plug (contact plug) PG including a tungsten (W) film as a main component is embedded in the contact hole. The plug PG penetrates through the interlayer dielectric film IL. The plug PG is formed on each of the n-type source region SR, the n-type drain region DR, and the p-type semiconductor region PR. Plug PG Here, the plug PG formed on the n-type source region SR and electrically connected to the n-type source region SR is referred to as a plug PGS. The plug PG formed on the n-type drain region DR and electrically connected to the n-type drain region DR is referred to as a plug PGD. The plug PG formed on the p-type semiconductor region PR and electrically connected to the p-type semiconductor region PR is referred to as a plug PGP. The plug PG may also be formed on the gate electrode GE, but the plug PG on the gate electrode GE is not shown in cross-sectional view of FIGS. 1 and 2.

The plug PGP is electrically connected to the p-type semiconductor region PR. The plug PGP penetrates through the interlayer dielectric film IL, passes through the recessed portion KB, and reaches the bottom surface thereof. At this time, the plug PGP passes through between the sidewall dielectric films SW2 provided in the recessed portion KB. The plug PGP reaches the bottom of the recessed portion KB, in other words, an upper surface of the p-type semiconductor region PR.

The plug PGP is in contact with the metal silicide layer SL formed on the p-type semiconductor region PR, and is electrically connected to the metal silicide layer SL. Accordingly, the plug PGP is electrically connected to the p-type semiconductor region PR via the metal silicide layer SL formed on the p-type semiconductor region PR. Further, the plug PGP is electrically connected to the p-type semiconductor region PB via the p-type semiconductor region PR. The plug PGP is in direct contact with the p-type semiconductor region PR and electrically connected to the p-type semiconductor region PR when the metal silicide layer SL is not formed on the p-type semiconductor region PR.

FIG. 2 is referred to. The plug PGS is electrically connected to the n-type source region SR. The plug PGS penetrates through the interlayer dielectric film IL and reaches an upper surface of the n-type source region SR. In the present embodiment, the plug PGS is in contact with the metal silicide layer SL formed on the n-type source regions SR, and is electrically connected to the metal silicide layer SL. The plug PGS is electrically connected to the n-type source region SR via the metal silicide layer SL. The plug PGS is in direct contact with the n-type source region SR and electrically connected to the n-type source region SR when the metal silicide layer SL is not formed on the n-type source region SR.

FIG. 3 is referred to. In plan view, the plug PGP is included in the recessed portion KB. A lower portion of the plug PGP is located in the recessed portion KB. Also in the recessed portion KB, a side surface (periphery) of the plug PGP is surrounded (covered) by the interlayer dielectric film IL. The plug PGP and the plug PGS are arranged on a straight line in the gate width direction. On this straight line, a boundary between the recessed portion KB and the source region SR is sandwiched between the plug PGP and the plug PGS. In the present embodiment, when the plug PG is viewed in the straight line in plan view, one plug PGS and two plugs PGP next to the one plug PGS are arranged. The arrangement pattern of the plug PGS and the plugs PGP may be repeated in the straight line. The number of plugs PGS and plugs PGP can be changed as needed.

As described above, the sidewall dielectric films SW2 having a sidewall spacer shape are formed on the side surfaces of the recessed portion KB. The plug PGP is not in contact with the side surface of the recessed portion KB. The sidewall dielectric films SW2 can more effectively prevent the plug PGP from contacting the epitaxial layer EP exposed from the side surfaces of the recessed portion KB. The plug PGP is electrically insulated from the source region SR by the sidewall dielectric films SW2.

Wirings (first layer wirings) M1 made of a conductive film mainly formed of aluminum (Al), aluminum alloy, or the like are formed on the interlayer dielectric film IL in which the plug PG is buried. The wirings M1 are preferably aluminum wirings, but may also be wirings, for example tungsten wirings or copper wirings, using other metal materials.

The wirings M1 have a source wiring MIS electrically connected to the n-type source region SR via the plug PGS, and a drain wiring MID electrically connected to the n-type drain region DR via the plug PGD. The source wiring MIS is electrically connected to the p-type semiconductor region PR via the plug PGP. That is, the source wiring MIS is electrically connected to both the plug PGS and the plug PGD. Therefore, the potential supplied from the plug PGS to the n-type source region SR and the potential supplied to the p-type semiconductor region PR via the plug PGP are the same. Therefore, the same potential as the potential (source potential) supplied from the source wiring MIS to the n-type source region SR via the plug PGS is supplied from the source wiring MIS to the p-type semiconductor region PR via the plug PGP, and is further supplied from the p-type semiconductor region PR to the p-type semiconductor region PB. The wirings M1 may further include a gate wiring electrically connected to the gate electrode GE via the plug PG, although the gate wiring is not shown in cross-sectional view of FIGS. 1 and 2.

The interlayer dielectric film IL and a structure above the wirings M1 are not shown and described here.

When a voltage (potential) equal to or higher than the threshold voltage is applied to the gate electrode GE, a channel (n-type inversion layer) is formed in the upper portion (upper layer portion) of the p-type semiconductor region PB located under the gate electrode GE. When the channel is formed, the n-type source region SR and the n-type drain region DR conduct via the channel and the n-type semiconductor region ND. In this state, if a large current flows between the n-type source region SR and the n-type drain region DR, the n-type source region SR may be at a higher potential than the p-type semiconductor region PB, and the parasitic bipolar transistor may operate (be turned on). However, by supplying the same potential as the potential supplied from the plug PGS to the n-type source region SR, from the plug PGD to the p-type semiconductor region PB via the p-type semiconductor region PR, when a large current flows between the n-type source region SR and the n-type drain region DR, the n-type source region SR can be prevented from becoming higher potential than the p-type semiconductor region PB, and the parasitic bipolar transistor can be prevented from operating. The parasitic bipolar transistor is an NPN bipolar transistor formed by the n-type semiconductor region ND, the p-type semiconductor region PB, and the n-type source region SR.

On-state breakdown voltage is a maximum voltage applied between the n-type source region SR and the n-type drain region DR without the parasitic bipolar transistor operating. By providing the p-type semiconductor region PR and supplying the same potential as the potential supplied to the source region SR to the p-type semiconductor region PB via the p-type semiconductor region PR, the on-state breakdown voltage of LDMOSFET can be increased.

Combination of Recessed Portion KB and P-Type Semiconductor Region PR

As can be seen from FIG. 3, a plurality of pairs of the recessed portion KB and the p-type semiconductor region PR under the recessed portion KB are provided in the epitaxial layer EP of the semiconductor substrate SB. The plurality of pairs are arranged spaced apart from each other in the Y direction (gate width direction). That is, a plurality of recessed portions KB are formed so as to pass through one n-type source region SR, and the plurality of recessed portions KB are arranged spaced apart from each other in the Y direction (gate width direction). The p-type semiconductor region PR is formed under each of the recessed portions KB. Accordingly, the n-type source region SR is present between the recessed portions KB adjacent to each other in the Y direction. Therefore, the plug PGS can be arranged on the n-type source region SR between the recessed portions KB adjacent to each other in the Y direction. The plug PGS can be electrically connected to the n-type source region SR. At least one plug PGP is arranged for each recessed portion KB. In FIG. 3, two plugs PGP are arranged for the respective recessed portion KB. The number of plugs PGP to be arranged with respect to the respective recessed portions KB may be one or three or more.

Manufacturing Process of Semiconductor Device

Next, the manufacturing process of the semiconductor device according to the present embodiment will be described referring to the drawings. FIGS. 5 to 20 are cross-sectional views of the main portions during the manufacturing process of the semiconductor device according to the present embodiment, and a cross section corresponding to FIG. 1 is shown.

Figure 5:
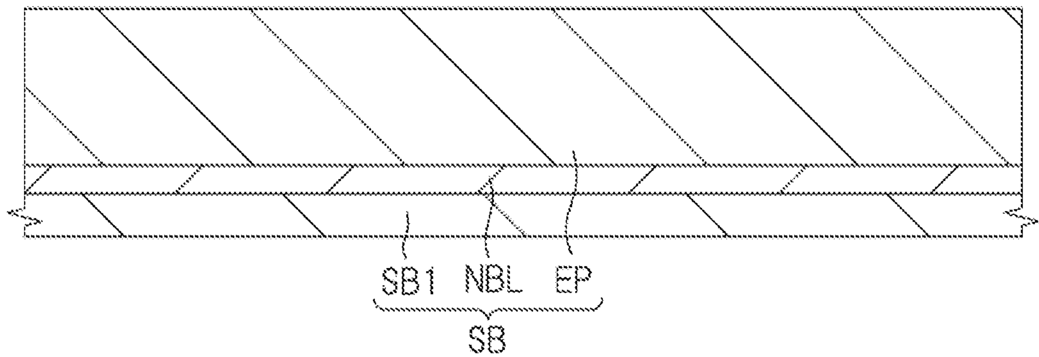
FIG. 5 is a cross-sectional view of a main portion during a manufacturing process of the semiconductor device according to one embodiment.

To manufacture the semiconductor device, first, the semiconductor substrate SB is prepared. For example, as shown in FIG. 5, the semiconductor substrate SB having the substrate main body SB1 made of p-type monocrystalline silicon or the like, the n-type buried layer NBL formed on the main surface (upper surface) of the substrate main body SB1, and the epitaxial layer EP made of p-type monocrystalline silicon or the like formed on the main surface (upper surface) of the buried layer NBL, is prepared. In this case, in the following, "main surface of semiconductor substrate SB" may be read as "main surface of epitaxial layer EP", and "main surface of epitaxial layer EP" may be read as "main surface of semiconductor substrate SB", because the main surface (upper surface) of the semiconductor substrate SB and the main surface (upper surface) of the epitaxial layer EP are synonymous with each other.

Next, the element isolation region (not shown) is formed on the main surface of the semiconductor substrate SB using, for example, an STI method or a LOCOS method.

Figure 6:
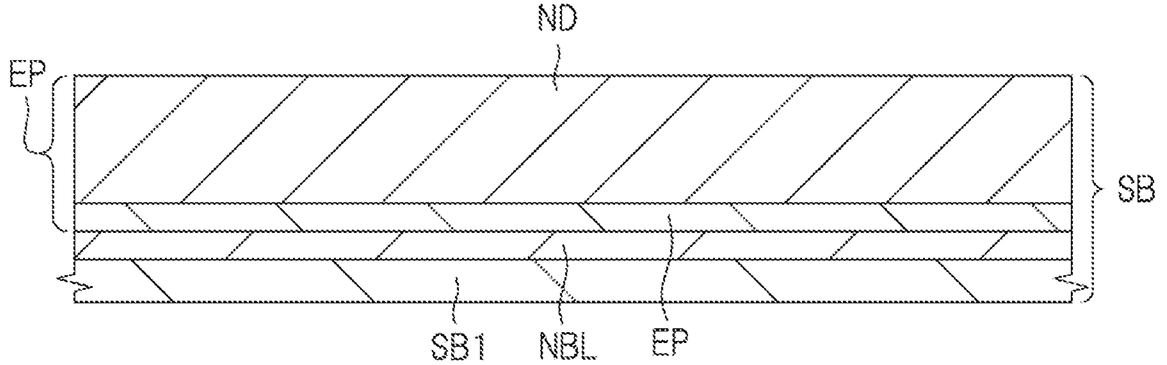
FIG. 6 is a cross-sectional view of the main portion during the manufacturing process of the semiconductor device following FIG. 5.

Next, as shown in FIG. 6, the n-type semiconductor region ND is formed by implanting n-type impurities into the upper portion (upper layer portion) of the epitaxial layer EP of the semiconductor substrate SB using an ion-implantation method or the like. The n-type semiconductor region ND is formed over a predetermined depth from the main surface (upper surface) of the epitaxial layer EP.

Figure 7:
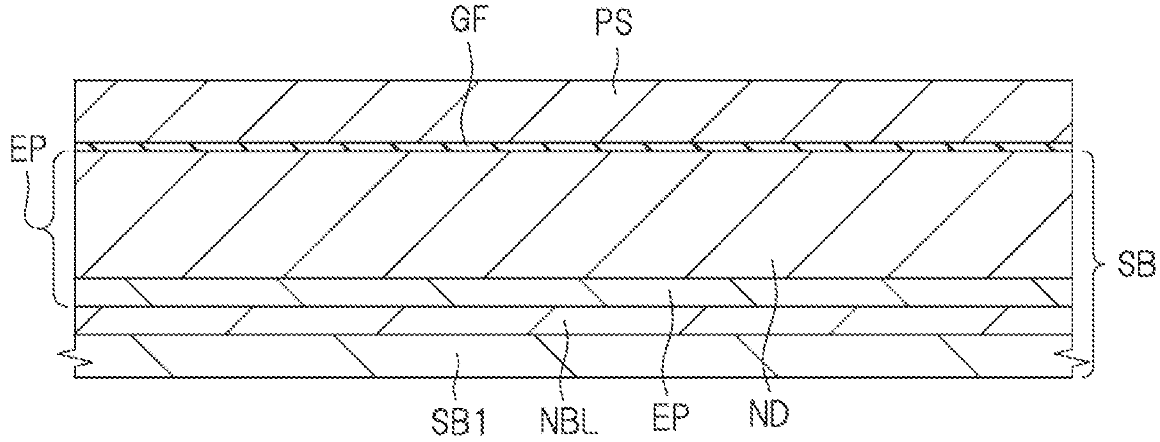
FIG. 7 is a cross-sectional view of the main portion during the manufacturing process of the semiconductor device following FIG. 6.

Next, after the main surface of the semiconductor substrate SB is cleaned, as shown in FIG. 7, the dielectric film GF is formed on the main surface of the semiconductor substrate SB. The dielectric film GF is made of a silicon oxide film or the like, and can be formed by a thermal oxidation method or the like.

Next, as shown in FIG. 7, a silicon film PS is formed as a conductive film for gate electrode GE on the main surface of the semiconductor substrate SB and thus on the dielectric film GF. The silicon film PS is made of, for example, a polysilicon film, and can be formed by a CVD (Chemical Vapor Deposition) method or the like.

Figure 8:
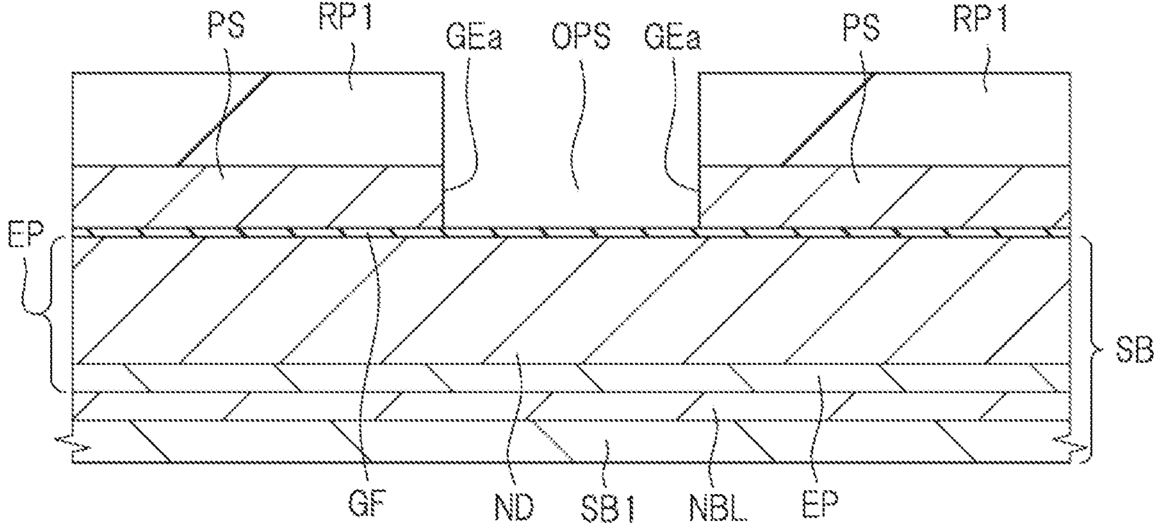
FIG. 8 is a cross-sectional view of the main portion during the manufacturing process of the semiconductor device following FIG. 7.

Next, as shown in FIG. 8, a photoresist pattern (resist pattern) RP1 is formed on the silicon film PS by a photolithography technique. Then, the silicon film PS is etched using the photoresist pattern RP1 as an etching mask. Thus, the silicon film PS on the source-side is removed and a pattern made of silicon film PS is formed. An opening portion OPS is formed in the pattern formed of the silicon film PS. As a side surface of the pattern, a side surface (sidewall) GEa is formed on the silicon film PS. The side surface GEa is a side surface (sidewall) of the gate electrode GE on a source-side. This stage is shown in FIG. 8. The opening portion OPS of the silicon film PS substantially corresponds to the opening portion of the photoresist pattern RP1 in plan view. In a region where the silicon film PS is removed by the etching, the dielectric film GF is exposed. When the dielectric film GF exposed without being covered with the silicon film PS is further etched and removed after the etching of the silicon film PS, the main surface (upper surface) of the semiconductor substrate SB is exposed.

Figure 9:
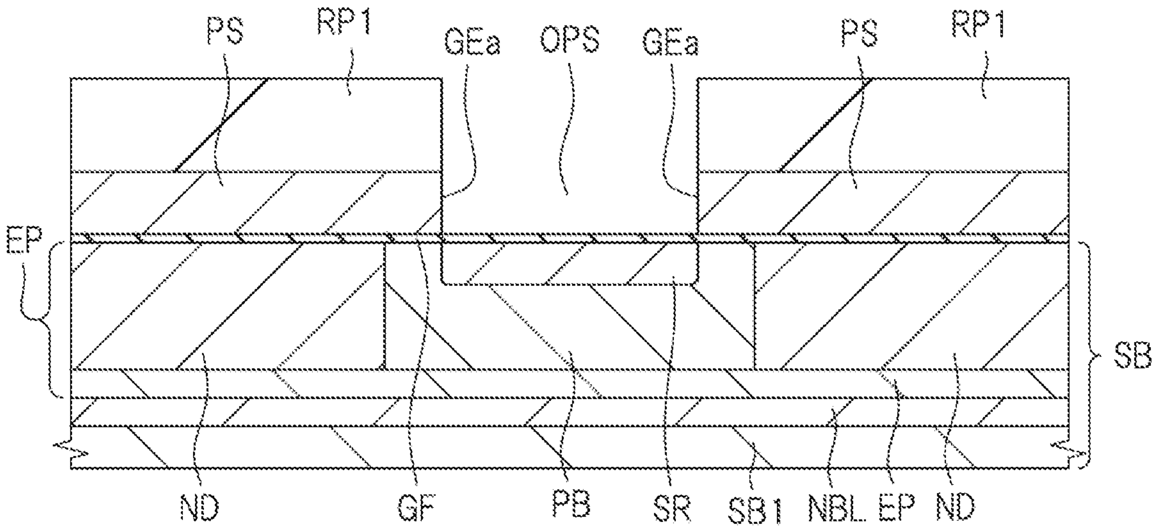
FIG. 9 is a cross-sectional view of the main portion during the manufacturing process of the semiconductor device following FIG. 8.

Next, as shown in FIG. 9, the p-type semiconductor region PB is formed in the epitaxial layer EP of the semiconductor substrate SB by implanting p-type impurities into the epitaxial layer EP of the semiconductor substrate SB by ion implantation using the photoresist pattern RP1 and the silicon film PS as a mask (ion implantation prevention mask). As the ion implantation for forming the p-type semiconductor region PB, oblique ion implantation is used. As a result, a part of the p-type semiconductor region PB overlaps with the gate electrode GE in plan view. Therefore, a part of the p-type semiconductor region PB is located under the gate electrode GE. The p-type semiconductor region PB is formed over a predetermined depth from the main surface (upper surface) of the epitaxial layer EP. When the p-type semiconductor region PB is formed, the p-type semiconductor region PB is adjacent to the n-type semiconductor region ND.

Next, as shown in FIG. 9, the n-type source region SR is formed in the epitaxial layer EP of the semiconductor substrate SB by implanting n-type impurities into the epitaxial layer EP of the semiconductor substrate SB by ion implantation using the photoresist pattern RP1 and the silicon film PS as a mask (ion implantation prevention mask). The n-type source region SR is formed by ion-implanting n-type impurities into the semiconductor substrate SB from the opening portion OPS of the pattern formed of the silicon film PS. As the ion implantation for forming the n-type source region SR, orthogonal ion implantation is used. As a result, the n-type source region SR is formed in self-alignment with the side surface GEa of the silicon film PS. That is, the n-type source region SR is formed in the semiconductor substrate SB not covered by the silicon film PS. The n-type source region SR is formed over a predetermined depth from the main surface (upper surface) of the epitaxial layer EP. In the epitaxial layer EP of the semiconductor substrate SB, the n-type source region SR is formed in the p-type semiconductor region PB. The depth of the n-type source region SR is smaller than the depth of the p-type semiconductor region PB. The bottom surface and the side surface of the formed n-type source region SR are covered with the p-type semiconductor region PB. Thereafter, the photoresist pattern RP1 is removed by asking or the like.

Figure 10:
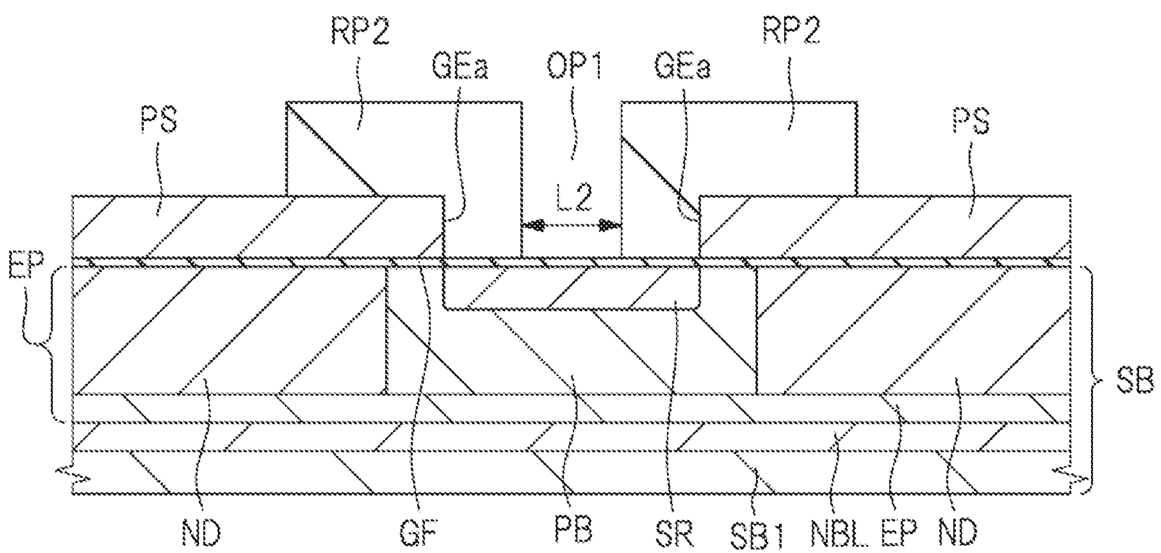
FIG. 10 is a cross-sectional view of the main portion during the manufacturing process of the semiconductor device following FIG. 9.

Next, as shown in FIG. 10, a photoresist pattern (resist pattern) RP2 is formed on the main surface of the semiconductor substrate SB by using a photolithography technique so as to cover a part of the silicon film PS to be the gate electrode GE and a part of the n-type source region SR. The photoresist pattern RP2 has an opening portion OP1 that exposes a part of the n-type source region SR (a region where the recessed portion KB is to be formed). The opening portion OP1 of the photoresist pattern RP2 is an opening portion for forming the recessed portion KB. The opening portion OP1 of the photoresist pattern RP2 is included in the n-type source region SR in plan view. In addition, the opening portion OP1 of the photoresist pattern RP2 is included in the opening portion OPS of the pattern formed of the silicon film PS in plan view. Therefore, the opening portion OP1 of the photoresist pattern RP2 exposes a part of the opening portion OPS of the pattern formed of the silicon film PS in plan view. The n-type source region SR other than the region where the recessed portion KB is to be formed is covered with the photoresist pattern RP2. In the present embodiment, the opening portion OP1 of the photoresist pattern PR2 is provided in a center portion of the n-type source region SR. Both sides of the photoresist pattern PR2 sandwiching the opening portion OP1 cover the n-type source region SR. In addition, the silicon film PS to be the gate electrode GE is covered with the photoresist pattern RP2. A part of the silicon film PS that does not serve as the gate electrode GE is exposed without being covered with the photoresist pattern RP2. In the gate length direction, the length (width L2) of the opening portion OP1 of the photoresist pattern PR2 is smaller than the length of the opening portion of the photoresist pattern RP1. In addition, in the gate length direction, the length of the opening portion OP1 of the photoresist pattern PR2 is smaller than the length of the opening portion OPS of the pattern formed of the silicon film PS.

Figure 12:
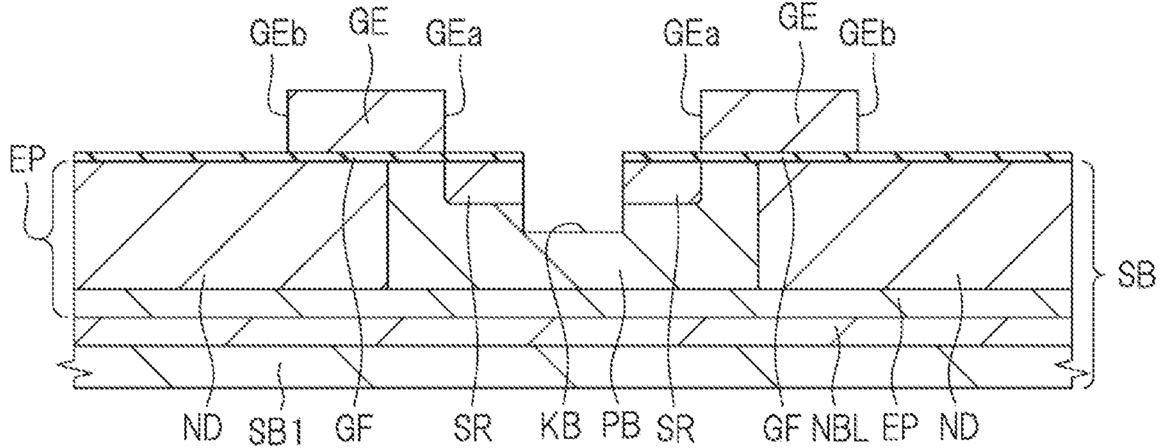
FIG. 12 is a cross-sectional view of the main portion during the manufacturing process of the semiconductor device following FIG. 11.

Next, as shown in FIG. 11, etching of the silicon film PS and etching of the epitaxial layer EP are performed by etching using the photoresist pattern RP2 as an etching mask. As a result, the silicon film PS exposed without being covered with the photoresist pattern RP2 is etched, whereby the silicon film PS on the drain-side is removed, and a side surface (sidewall) GEb is formed on the silicon film PS. The side surface GEb is a side surface (sidewall) of the gate electrode GE on a drain-side. Further, the recessed portion KB is formed in the semiconductor substrate SB (epitaxial layer EP) by etching the dielectric film GF exposed at the bottom of the opening portion OP1 of the photoresist pattern RP2 and the semiconductor substrate SB (epitaxial layer EP) under the dielectric film GF. The depth of the recessed portion KB is smaller than the depth of the p-type semiconductor region PB, and the p-type semiconductor region PB is present under the bottom surface of the recessed portion KB. Thereafter, as shown in FIG. 12, the photoresist pattern RP2 is removed by asking or the like.

The silicon film PS is patterned by etching using the photoresist pattern RP1 (etching in FIG. 8) and etching using the photoresist pattern RP2 (etching in FIG. 11), then the gate electrode GE is formed. The gate electrode GE is formed of the patterned silicon film PS, a side surface of the gate electrode GE on the source-side is the side surface GEa formed by etching using the photoresist pattern RP1, and a side surface of the gate electrode GE on the drain-side is the side surface GEb formed by etching using the photoresist pattern RP2. The dielectric film GF remaining under the gate electrode GE is a gate dielectric film of LDMOSFET. The gate electrode GE is formed on the epitaxial layer EP of the semiconductor substrate SB via the dielectric film GF.

Further, since the recessed portion KB is formed by etching the dielectric film GF and the semiconductor substrate SB (epitaxial layer EP) at the bottom of the opening portion OP1 of the photoresist pattern RP2, the recessed portion KB is formed so as to be aligned with the opening portion OP1 of the photoresist pattern RP2. The depth of the recessed portion KB is larger than the depth of the n-type source region SR (that is, the bottom surface of the recessed portion KB is located deeper than the bottom surface of the n-type source region SR), and the recessed portion KB is formed so as to penetrate through the n-type source region SR. The formed recessed portion KB is included in the n-type source region SR in plan view, and surrounded by the n-type source region SR. The photoresist pattern RP2 also serves as an etching mask for patterning the silicon film PS and an etching mask for forming the recessed portion KB.

Figure 13:
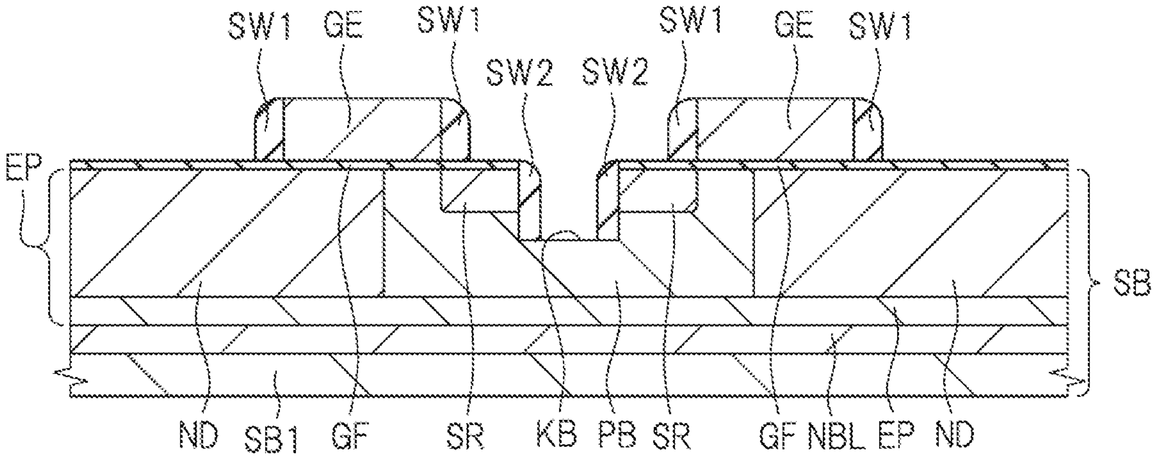
FIG. 13 is a cross-sectional view of the main portion during the manufacturing process of the semiconductor device following FIG. 12.

Next, as shown in FIG. 13, sidewall spacers SW1 are formed on both side surfaces (GEa,GEb) of the gate electrode GE. For example, the sidewall spacers SW1 can be formed by forming a dielectric film (for example, a silicon oxide film) for forming sidewall spacers on the main surface (including the bottom surface and the side surface of the recessed portion KB) of the semiconductor substrate SB by using a CVD method or the like so as to cover the gate electrode GE, and then etching back the dielectric film by using an anisotropic etching technique. When the sidewall spacers SW1 are formed on both side surfaces of the gate electrode GE, the sidewall dielectric films SW2 having a sidewall spacer shape may be formed on the side surfaces (sidewalls) of the recessed portion KB. The sidewall spacers SW1 and the sidewall dielectric films SW2 are formed in the same step.

Figure 14:
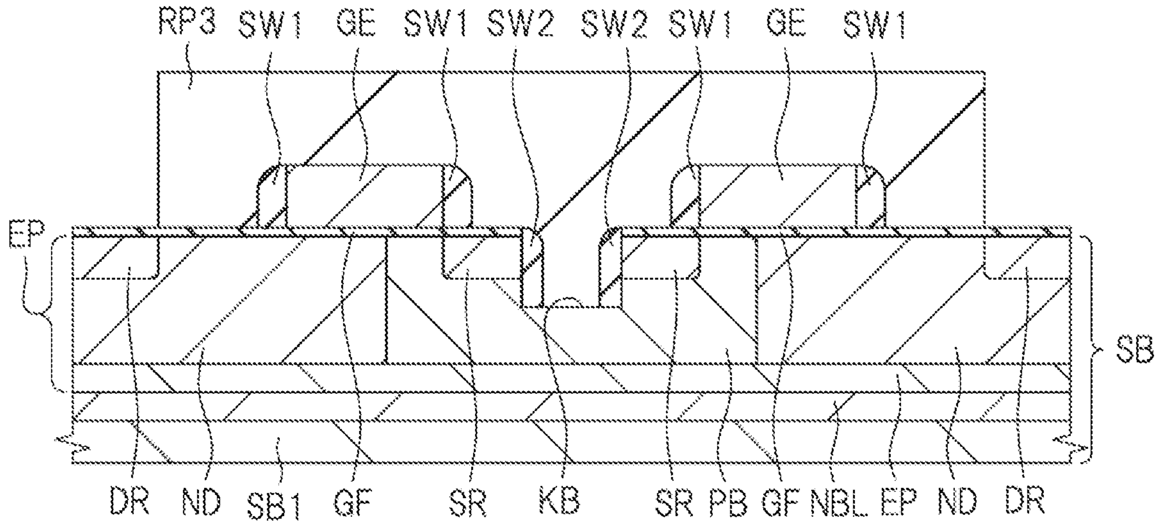
FIG. 14 is a cross-sectional view of the main portion during the manufacturing process of the semiconductor device following FIG. 13.

Next, as shown in FIG. 14, a photoresist pattern (resist pattern) RP3 is formed on the main surface of the semiconductor substrate SB by a photolithography technique so as to cover the gate electrode GE, the sidewall spacers SW1, the n-type source region SR, and the recessed portion KB. The region where the n-type drain region DR is to be formed with is not covered with the photoresist pattern RP3.

Next, as shown in FIG. 14, the n-type drain region DR is formed in the epitaxial layer EP of the semiconductor substrate SB by implanting n-type impurities into the epitaxial layer EP of the semiconductor substrate SB by ion implantation using the photoresist pattern RP3 as a mask (ion implantation device mask). In the epitaxial layer EP of the semiconductor substrate SB, the n-type drain region DR is formed in the n-type semiconductor region ND. This stage is shown in FIG. 14. Thereafter, the photoresist pattern RP3 is removed by asking or the like.

Figure 15:
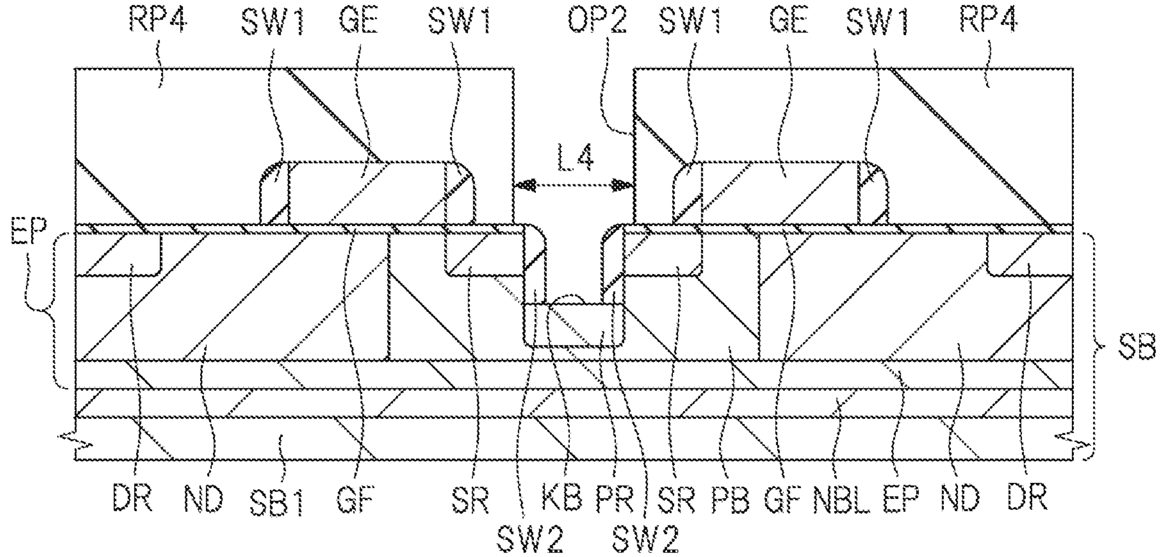
FIG. 15 is a cross-sectional view of the main portion during the manufacturing process of the semiconductor device following FIG. 14.

Next, as shown in FIG. 15, a photoresist pattern (resist pattern) RP4 is formed on the main surface of the semiconductor substrate SB by a photolithography technique so as to cover the gate electrode GE, the sidewall spacers SW1, and the n-type drain region DR. The photoresist pattern RP4 has an opening portion OP2 for forming the p-type semiconductor region PR. The opening portion OP2 of the photoresist pattern RP4 overlaps with the recessed portion KB in plan view. Therefore, at least a part of the recessed portion KB of the semiconductor substrate SB (epitaxial layer EP) is exposed from the opening portion OP2 of the photoresist pattern RP4.

Figure 16:
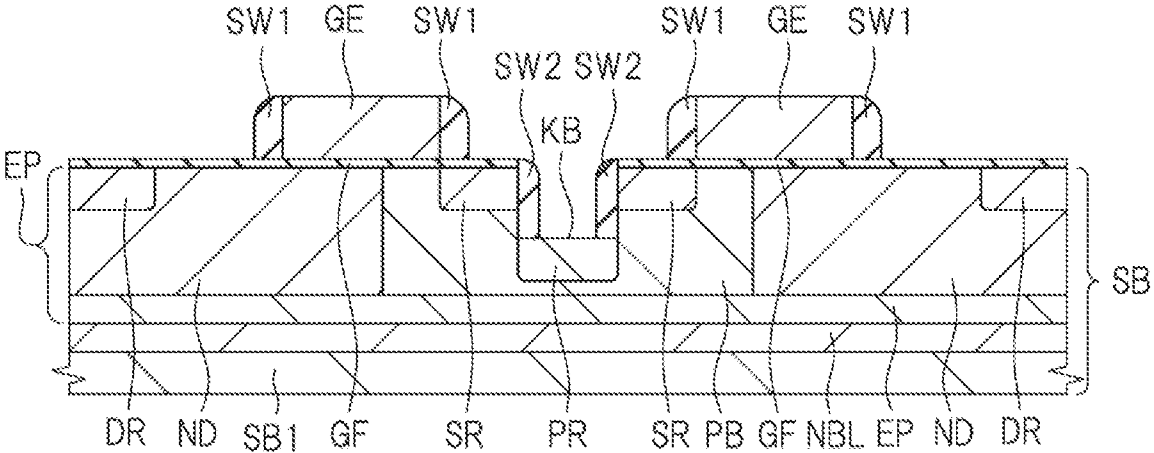
FIG. 16 is a cross-sectional view of the main portion during the manufacturing process of the semiconductor device following FIG. 15.

Next, as shown in FIG. 15, the p-type semiconductor region PR is formed in the epitaxial layer EP of the semiconductor substrate SB by implanting p-type impurities into the epitaxial layer EP of the semiconductor substrate SB by ion implantation using the photoresist pattern RP4 as a mask (ion implantation prevention mask). In this ion-implantation, p-type impurities are implanted into the semiconductor substrate SB (epitaxial layer EP) exposed from the opening portion OP2 of the photoresist pattern RP4, so that the p-type semiconductor region PR is formed under the recessed portion KB. In the epitaxial layer EP of the semiconductor substrate SB, the p-type semiconductor region PR is formed over a predetermined depth from the bottom surface of the recessed portion KB. The bottom surface and the side surface of the p-type semiconductor region PR is covered with the p-type semiconductor region PB. The impurity concentration (p-type impurity concentration) of the p-type semiconductor region PR is higher than the impurity concentration (p-type impurity concentration) of the p-type semiconductor region PB. Thereafter, as shown in FIG. 16, the photoresist pattern RP4 is removed by asking or the like.

In plan view, when the opening portion OP2 of the photoresist pattern RP4 is included in the recessed portion KB (including a case where the opening portion OP2 of the photoresist pattern RP4 corresponds to the recessed portion KB in plan view), the n-type source region SR is not exposed from the opening portion OP2 of the photoresist pattern RP4. In this case, when the ion implantation using the photoresist pattern RP4 (ion implantation for forming the p-type semiconductor region PR), the p-type impurities are hardly implanted into the n-type source region SR in the vicinity of the recessed portion KB.

In addition, in plan view, a part of the opening portion OP2 of the photoresist pattern RP4 may be formed outward from the recessed portion KB. In this case, when the ion implantation using the photoresist pattern RP4 (ion implantation for forming the p-type semiconductor region PR), the p-type impurities are implanted, in the vicinity of the recessed portion KB, into the n-type source region SR exposed from the opening portion OP2 of the photoresist pattern RP4. In this case, there is a possibility that the effective n-type impurity concentration of the n-type source region SR is partially lowered in the vicinity of the recessed portion KB due to ion implantation (ion implantation for forming the p-type semiconductor region PR) using the photoresist pattern RP4, but there is no particular issue in the function of the n-type source region SR as the source region.

Therefore, in plan view, it is possible to secure the margin of the forming position of the opening portion RP4 in the photoresist pattern RP2 because it can be tolerated not only when the opening portion OP2 of the photoresist pattern RP4 is included in the recessed portion KB but also when a part of the opening portion OP2 of the photoresist pattern RP4 is outward from the recessed portion KB. Therefore, the photoresist pattern RP4 can be easily formed, and the photoresist pattern RP4 forming process can be easily controlled.

Next, activation annealing, which is a heat treatment for activating impurities implanted (implantation) so far, is performed.

Next, a metal silicide layer SL is formed. Specifically, the metal silicide layer SL can be formed as follows.

Figure 17:
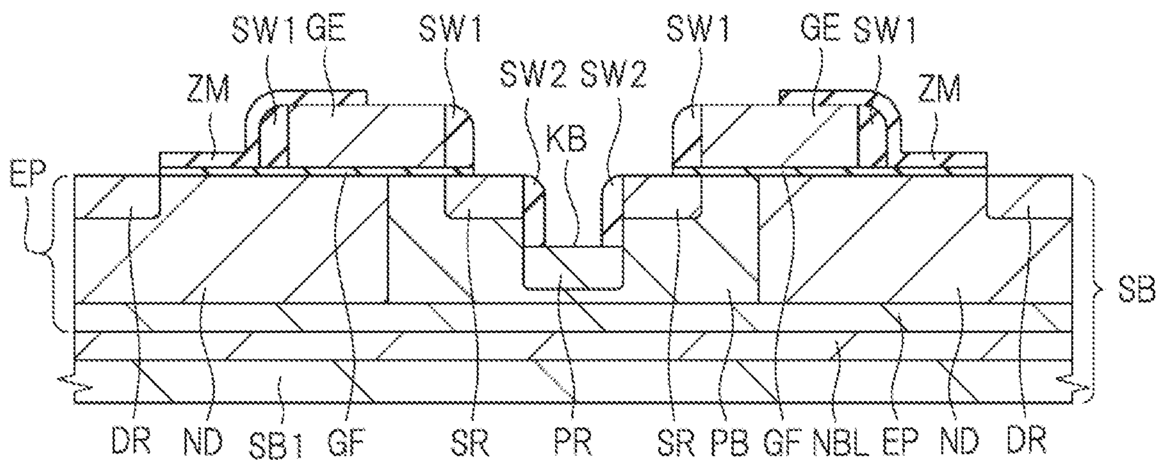
FIG. 17 is a cross-sectional view of the main portion during the manufacturing process of the semiconductor device following FIG. 16.

First, as shown in FIG. 17, a dielectric film (silicide block film) ZM for preventing the metal silicide layer SL from being formed is formed. The dielectric film ZM can be formed, for example, by forming the dielectric film on the main surface of the semiconductor substrate SB so as to cover the gate electrode GE, the sidewall spacers SW1, and the sidewall dielectric films SW2, and then patterning the dielectric film.

Figure 18:
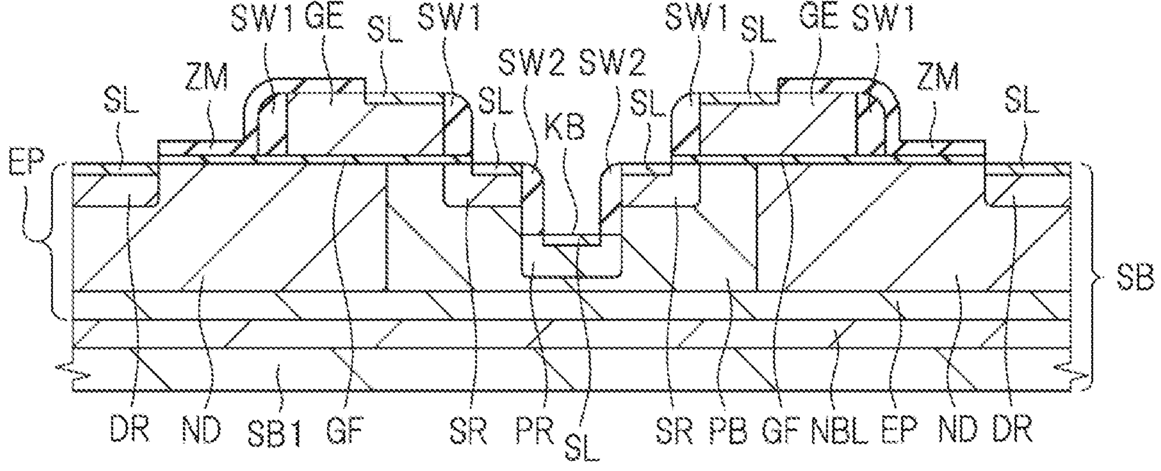
FIG. 18 is a cross-sectional view of the main portion during the manufacturing process of the semiconductor device following FIG. 17.

Then, a metal film (a metal film for forming the metal silicide layer SL) is formed over the entire main surface of the semiconductor substrate SB including the n-type drain region DR, the n-type source region SR, the p-type semiconductor region PR, and the upper surface of the gate electrode GE so as to cover the gate electrode GE and the sidewall spacers SW1. The metal film for forming the metal silicide layer SL is made of, for example, a cobalt (Co) film, a nickel (Ni) film, a nickel platinum-alloy film, or the like, and can be formed by a sputtering method or the like. Then, by performing a heat treatment on the semiconductor substrate SB, each upper portion (surface layer portion) of the n-type drain region DR, the n-type source region SR, the p-type semiconductor region PR, and the gate electrode GE is reacted with the metal film for forming the metal silicide layer SL. As a result, as shown in FIG. 18, the metal silicide layer SL is formed on each upper portion (upper surface, upper layer portion) of the n-type drain region DR, the n-type source region SR, the p-type semiconductor region PR, and the gate electrode GE. The metal silicide layer SL is formed of, for example, a cobalt silicide layer, a nickel silicide layer, or a platinum-doped nickel silicide layer. Thereafter, the unreacted metal film (metal film for forming the metal silicide layer SL) is removed by wet etching or the like. This stage is shown in FIG. 18. Further, after the unreacted metal film is removed, a heat treatment may be further performed.

As described above, by performing the so-called Salicide (Self Aligned Silicide) process, the metal silicide layer SL is formed on each of the n-type drain region DR, the n-type source region SR, the p-type semiconductor region PR, and the gate electrode GE, and the diffusive resistance and the contact resistance can be reduced. By using the Salicide process, the metal silicide layer SL can be formed on each of the n-type drain region DR, the n-type source region SR, the p-type semiconductor region PR, and the gate electrode GE in a self-aligned manner. The formation of metal silicide layer SL may be omitted.

Figure 19:
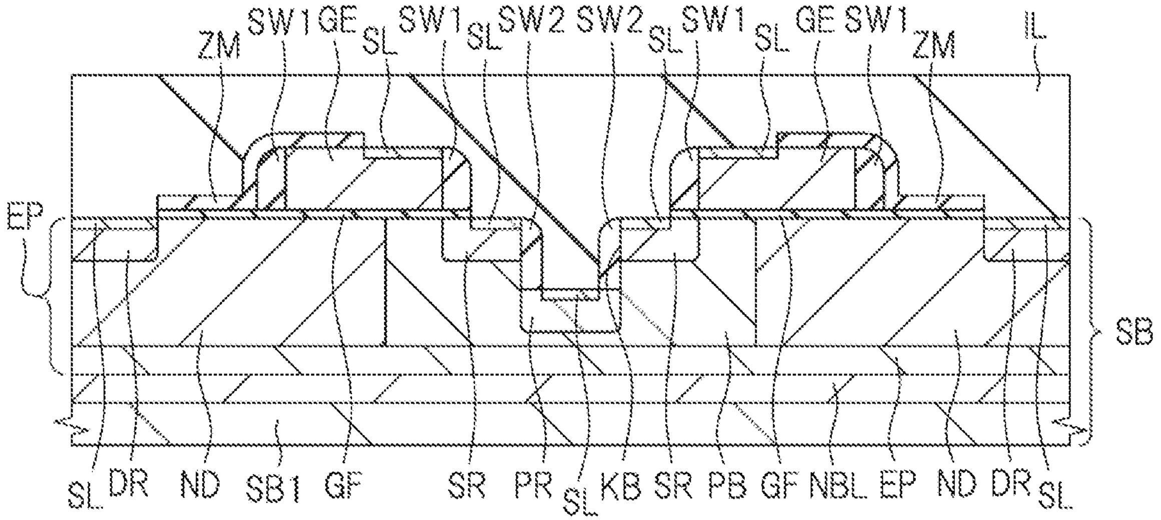
FIG. 19 is a cross-sectional view of the main portion during the manufacturing process of the semiconductor device following FIG. 18.

Next, as shown in FIG. 19, the interlayer dielectric film IL is formed on the main surface of the semiconductor substrate SB, that is, on the epitaxial layer EP, by using a CVD method or the like so as to cover the gate electrode GE and the sidewall spacers SW1. The interlayer dielectric film IL is also formed in the recessed portion KB. After the interlayer dielectric film IL is formed, the upper surface of the interlayer dielectric film IL can be polished and planarized by a CMP (Chemical Mechanical Polishing) method or the like.

Figure 20:
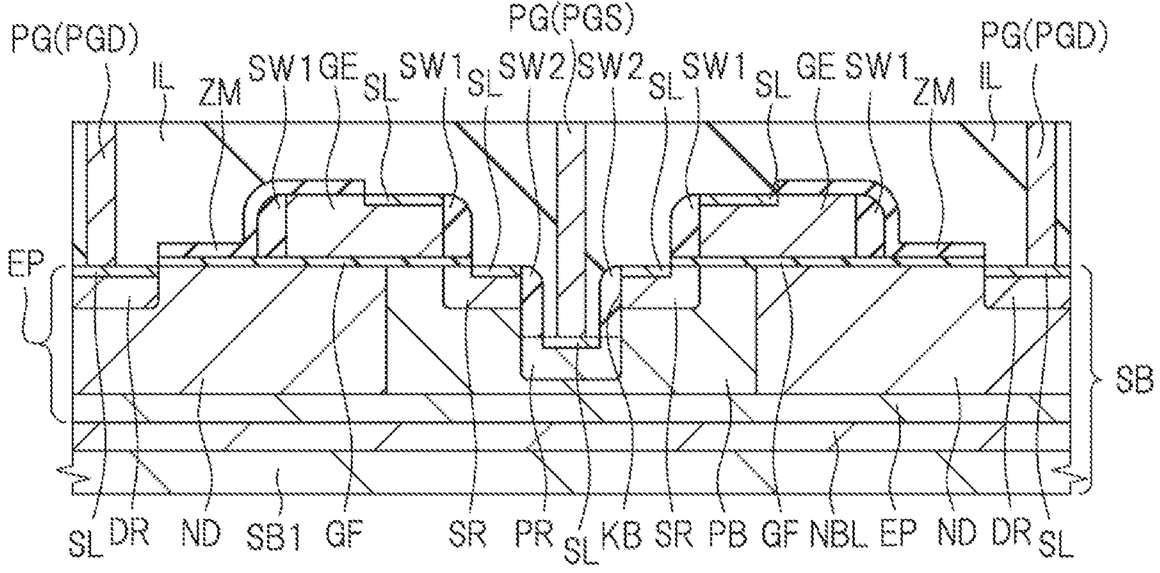
FIG. 20 is a cross-sectional view of the main portion during the manufacturing process of the semiconductor device following FIG. 19.

Next, as shown in FIG. 20, by etching the interlayer dielectric film IL using a photoresist pattern (not shown) formed on the interlayer dielectric film IL as an etching mask, the contact hole (through-hole) is formed in the interlayer dielectric film IL, and then the conductive plug PG is formed in the contact hole as a connecting conductor portion.

For example, a barrier conductive film is formed on the interlayer dielectric film IL including the bottom surface and the side surface of the contact hole, and then a main conductor film (for example, a tungsten film) is formed on the barrier conductive film so as to fill the contact hole, and thereafter, an unnecessary main conductive film and the barrier conductive film outside the contact hole are removed by a CMP method or the like. Thus, the plug PG can be formed.

The plug PG includes the plug PGS electrically connected to the n-type source region SR, the plug PGD electrically connected to the n-type drain region DR, the plug PGP electrically connected to the p-type semiconductor region PR, and the plug (not shown) electrically connected to the gate electrode GE.

The plug PGS is in contact with the metal silicide layer SL formed on the n-type source region SR, is electrically connected to the metal silicide layer SL, and is electrically connected to the n-type source region SR via the metal silicide layer SL. The plug PGD is in contact with the metal silicide layer SL formed on the n-type drain region DR, is electrically connected to the metal silicide layer SL, and is electrically connected to the n-type drain region DR via the metal silicide layer SL.

The contact hole for the plug PGP is formed so as to be included in the recessed portion KB. Therefore, the metal silicide layer SL formed on the p-type semiconductor region PR is exposed at the bottom of the contact hole for the plug PGP. The plug PGP buried in the contact hole for the plug PGP penetrates through the interlayer dielectric film IL, passes through between the sidewall dielectric films SW2 provided in the recessed portion KB, and reaches the bottom surface of the recessed portion KB. The plug PGP is in contact with and electrically connected to the metal silicide layer SL formed on the p-type semiconductor region PR. Accordingly, the plug PGP is electrically connected to the p-type semiconductor region PR via the metal silicide layer SL formed on the p-type semiconductor region PR, and is further electrically connected to the p-type semiconductor region PB via the p-type semiconductor region PR.

Next, as shown in FIGS. 1 and 2, the wirings M1 are formed on the interlayer dielectric film IL in which the plug PG is buried. For example, a conductive film (metal film) for forming wirings M1 is formed on the interlayer dielectric film IL in which the plug PG is buried, and then the conductive film is patterned by using a photolithography technique and an etching technique, whereby the wirings M1 made of the patterned conductive film can be formed. Damascene wirings can also be used as wirings M1.

The illustration and description of the subsequent steps will be omitted here.

Examined Example

Figure 21:
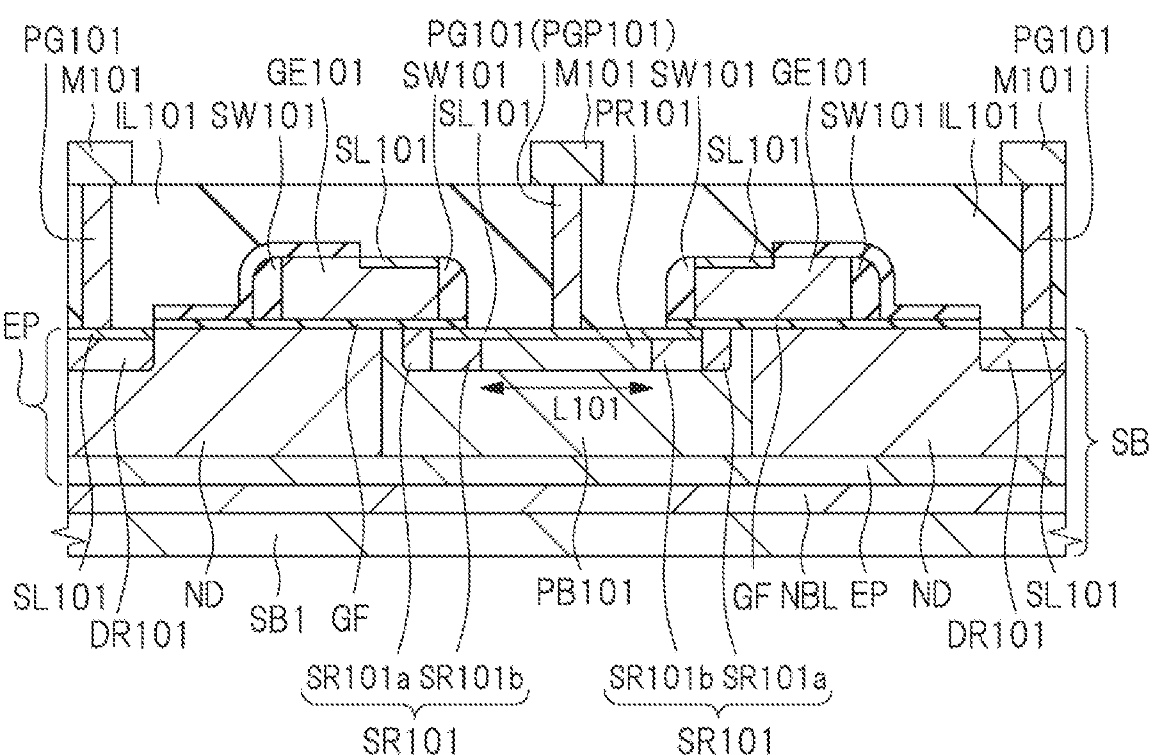
FIG. 21 is a cross-sectional view of a main portion of a semiconductor device according to an examined example.
Figure 22:
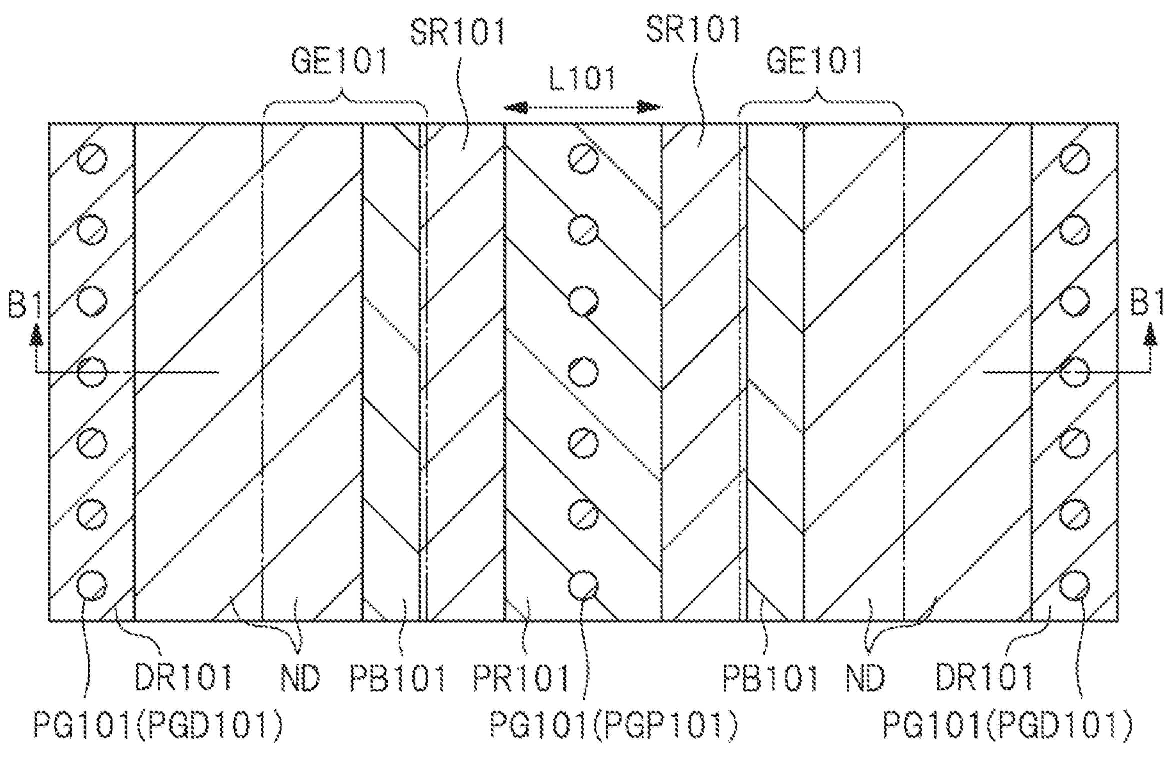
FIG. 22 is a plan view of the main portion of the semiconductor device according to the examined example.
Figure 22:
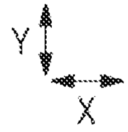

FIG. 21 is a cross-sectional view of a main portion of a semiconductor device according to the examined example studied by the present inventor, and FIG. 22 is a plan view of the main portion of the semiconductor device according to the examined example studied by the present inventor. FIG. 21 shows a cross section substantially parallel to the gate length, and cross-sectional view along B1-B1 line in FIG. 22 substantially corresponds to FIG. 21.

The structure of the semiconductor device according to the examined example shown in FIGS. 21 and 22 is different from the structure of the semiconductor device (FIGS. 1 to 3) according to the first embodiment, and the difference will be described below.

In the semiconductor device of the examined example shown in FIGS. 21 and 22, those corresponding to the recessed portion KB and the sidewall dielectric films SW2 are not formed. The p-type semiconductor region PR101 corresponding to the p-type semiconductor region PR is formed in an upper portion (surface layer portion) of the semiconductor substrate SB (epitaxial layer EP) so as to be adjacent to the n-type source region SR101 in the gate length direction (X direction). The n-type source region SR101 and the p-type semiconductor region PR101 extend in the Y direction. In the thickness direction of the semiconductor substrate SB, the n-type source region SR101 and the p-type semiconductor region PR101 are substantially in the same position.

The n-type source region SR101 corresponds to the n-type source region SR, but the n-type source region SR101 includes a low-concentration semiconductor region SR101*a* and a high-concentration semiconductor region SR101*b*. The high-concentration semiconductor region SR101*b* has an n-type impurity concentration higher than that of the low-concentration semiconductor region SR101*a*. In the gate length direction (X direction), the low-concentration semiconductor region SR101*a* is arranged between the high-concentration semiconductor region SR101*b* and the channel forming region. The low-concentration semiconductor region SR101*a* is located under the sidewall spacer SW101 formed on the side surface of the gate electrode GE on the source-side.

Metal silicide layers SL101 corresponding to the metal silicide layer SL are formed on the upper portion of the high-concentration region SR101*b* of the n-type source region SR101 and the upper portion of the p-type semiconductor region PR101, and the metal silicide layers SL101 are connected to each other. A plug PGP101 corresponding to the plug PGP is located on the p-type semiconductor region PR101, is electrically connected to the p-type semiconductor region PR101 via the metal silicide layer SL101, and is further electrically connected to the p-type semiconductor region PB101 corresponding to the p-type semiconductor region PB via the p-type semiconductor region PR101. The plug PGP101 is electrically connected to the high-concentration region SR101*b* of the n-type source region SR101 via the metal silicide layer SL101.

Since the other structure of the semiconductor device of the examined example of FIGS. 21 and 22 is similar to the structure of the semiconductor device of the first embodiment (FIGS. 1 to 3), repeated explanation thereof will be omitted here.

Next, the manufacturing process of the semiconductor device of the examined example will be described with reference to FIGS. 23 to 30. FIGS. 23 to 30 are cross-sectional views of the main portion during the manufacturing process of the semiconductor device of the examined example, and cross sections corresponding to the above-described FIG. 21 are shown.

In the examined example, after the configuration of FIG. 7 is obtained as described above, as shown in FIG. 23, the silicon film PS is etched using a photoresist pattern RP101 as an etching mask after the photoresist pattern RP101 is formed on the silicon film PS. Thus, the silicon film PS on the source-side is removed.

Figure 24:
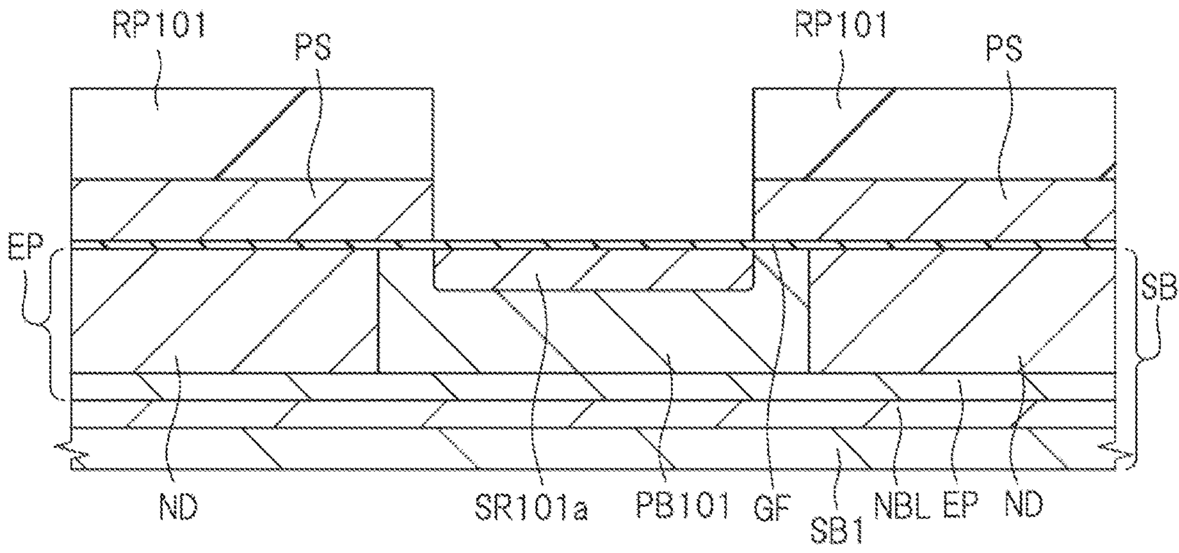
FIG. 24 is a cross-sectional view of the main portion during the manufacturing process of the semiconductor device following FIG. 23.

Next, as shown in FIG. 24, the p-type semiconductor region PB101 is formed in the epitaxial layer EP of the semiconductor substrate SB by performing oblique ion implantation of p-type impurities using the photoresist pattern RP101 and the silicon film PS as ion implantation prevention masks.

Next, as shown in FIG. 24, a low-concentration semiconductor region SR101*a* is formed in the epitaxial layer EP of the semiconductor substrate SB by implanting n-type impurities using the photoresist pattern RP101 and the silicon film PS as an ion implantation prevention mask. The n-type impurity concentration of the low-concentration semiconductor region SR101*a* is lower than the n-type impurity concentration of the n-type source region SR101. Thereafter, the photoresist pattern RP101 is removed.

Figure 25:
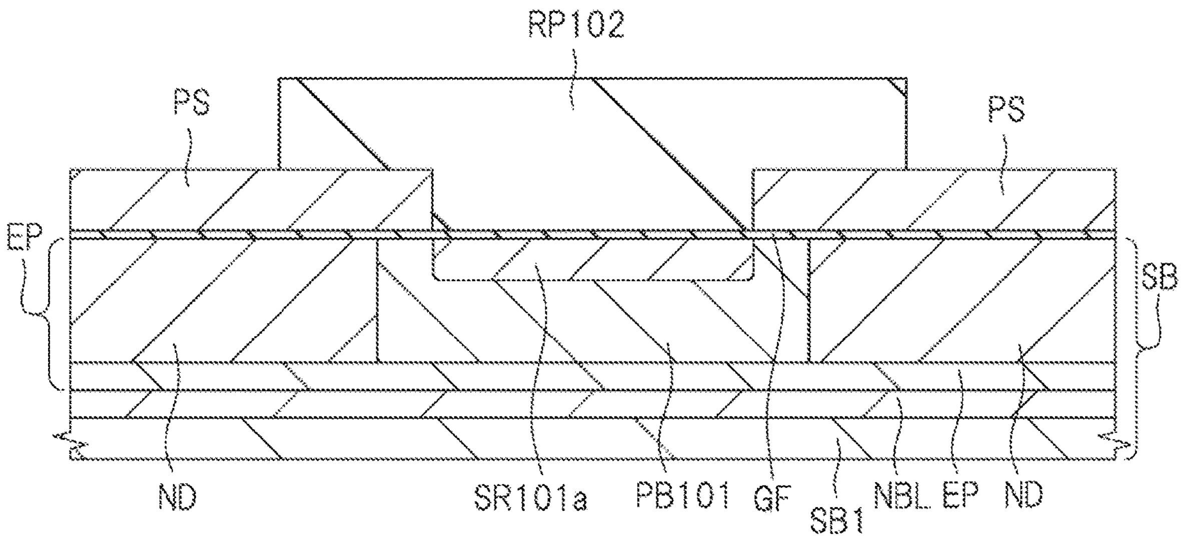
FIG. 25 is a cross-sectional view of the main portion during the manufacturing process of the semiconductor device following FIG. 24.

Next, as shown in FIG. 25, a photoresist pattern RP102 is formed on the silicon film PS. The photoresist pattern RP102 does not have an opening portion corresponding to the opening portion OP1 of the photoresist pattern RP2, and the entire low-concentration semiconductor region SR101*a* is covered with the photoresist pattern RP102. In addition, a portion of the silicon film PS serving as the gate electrode GE101 is covered with the photoresist pattern RP102, but a portion of the silicon film PS not serving as the gate electrode is exposed without being covered with the photoresist pattern RP102.

Figure 26:
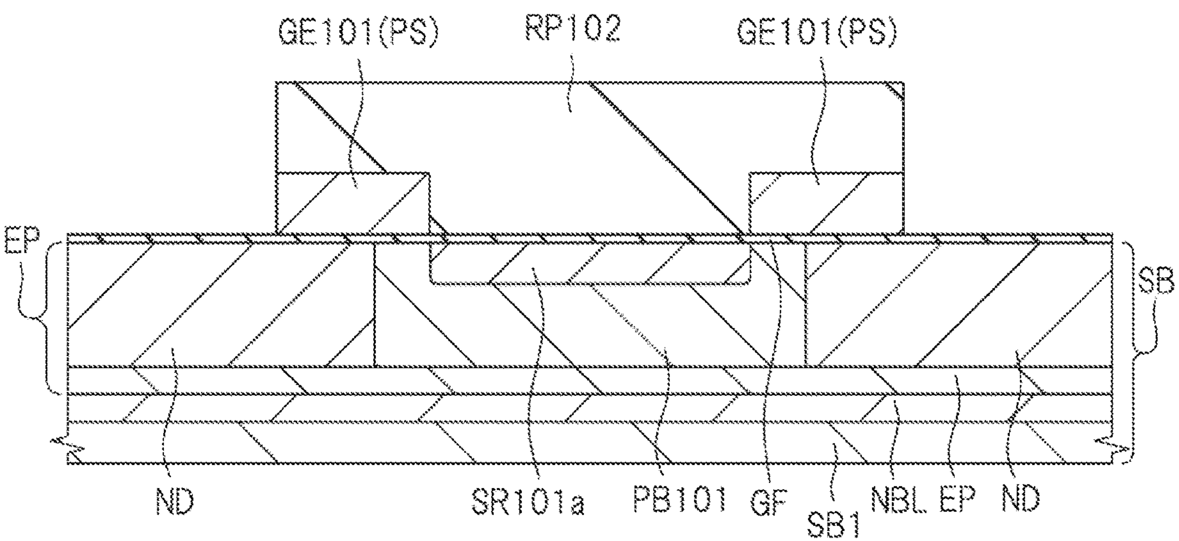
FIG. 26 is a cross-sectional view of the main portion during the manufacturing process of the semiconductor device following FIG. 25.

Next, as shown in FIG. 26, the silicon film PS is etched using the photoresist pattern RP102 as an etching mask. Thus, the silicon film PS on the drain-side is removed. In the examined example, a portion corresponding to the recessed portion KB is not formed. Thereafter, the photoresist pattern RP102 is removed.

The silicon film PS is patterned by etching using the photoresist pattern RP101 and etching using the photoresist pattern RP102, and the gate electrode GE101 is formed.

Figure 27:
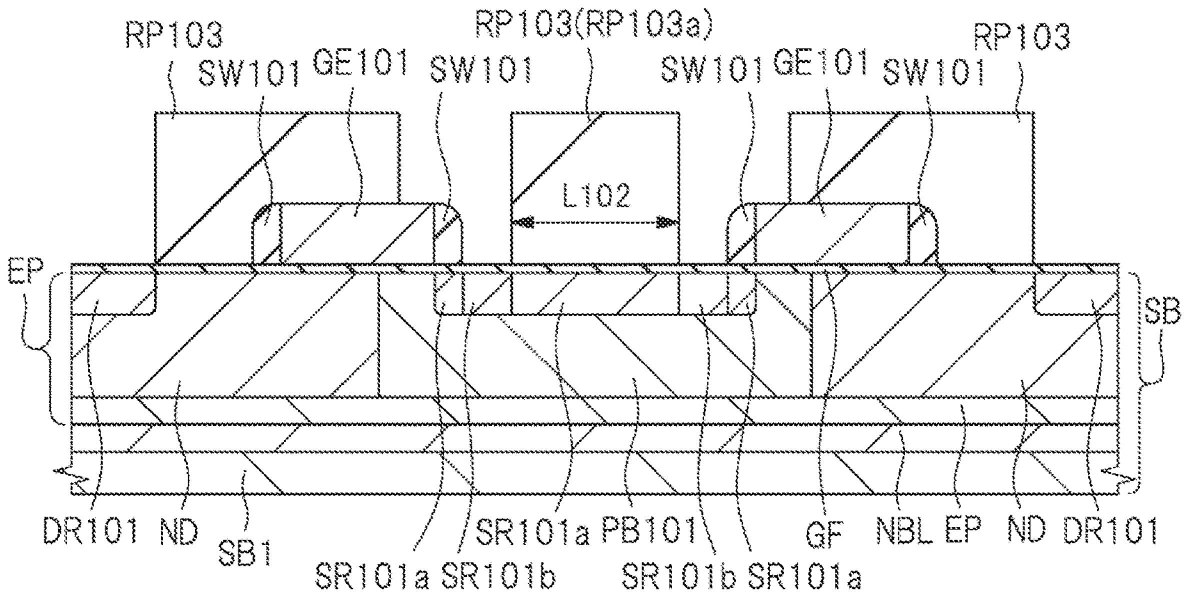
FIG. 27 is a cross-sectional view of the main portion during the manufacturing process of the semiconductor device following FIG. 26.

Next, as shown in FIG. 27, the sidewall spacers SW1 are formed on both side surfaces of the gate electrode GE101. In the examined example, a structure corresponding to the recessed portion KB is not formed, and therefore, a structure corresponding to the sidewall dielectric films SW2 is not formed.

Next, as shown in FIG. 27, a photoresist pattern RP103 is formed on the main surface of the semiconductor substrate SB. A region where the p-type semiconductor region PR101 is to be formed is covered with the photoresist pattern RP103, but the region where the n-type drain region DR101 is to be formed and the region where the high-concentration semiconductor region SR101*b* is to be formed are not covered with the photoresist pattern RP103.

Next, as shown in FIG. 27, the n-type drain region DR101 and the high-concentration semiconductor region SR101*b* are formed in the epitaxial layer EP of the semiconductor substrate SB by implanting n-type impurities using the photoresist pattern RP103 as an ion implantation prevention mask. This stage is shown in FIG. 27. Thereafter, the photoresist pattern RP103 is removed.

Figure 28:
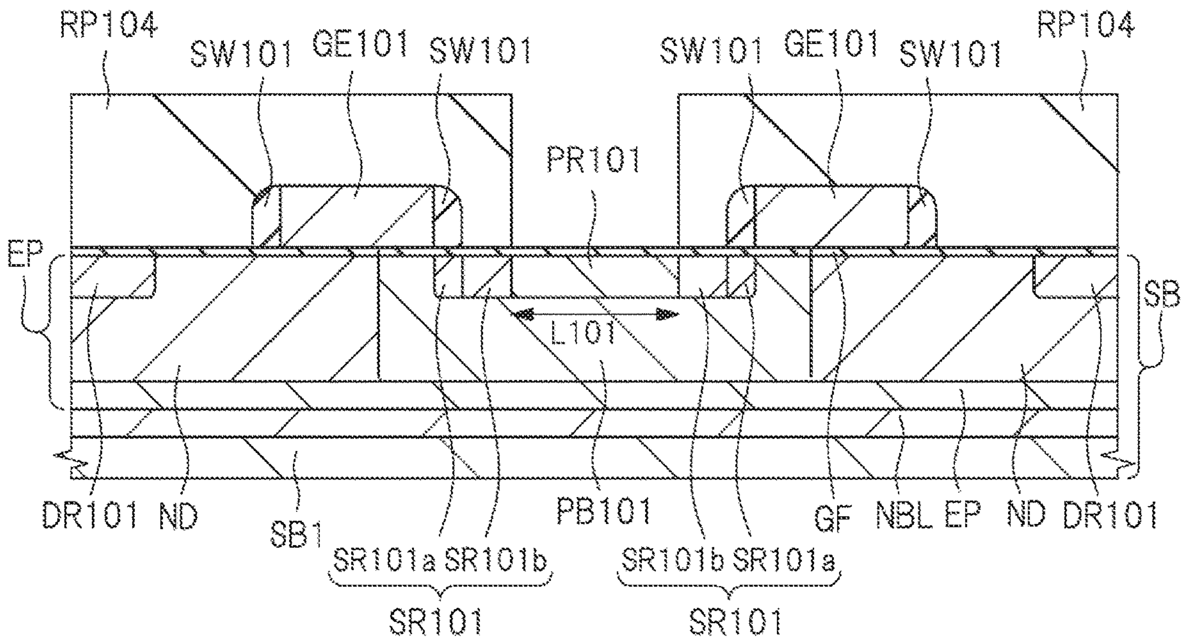
FIG. 28 is a cross-sectional view of the main portion during the manufacturing process of the semiconductor device following FIG. 27.

Next, as shown in FIG. 28, a photoresist pattern RP104 is formed on the main surface of the semiconductor substrate SB. The gate electrode GE101, the n-type drain region DR101, and the high-concentration semiconductor region SR101*b* are covered with the photoresist pattern RP104. The region where the p-type semiconductor region PR101 is to be formed is not covered with the photoresist pattern RP104.

Figure 29:
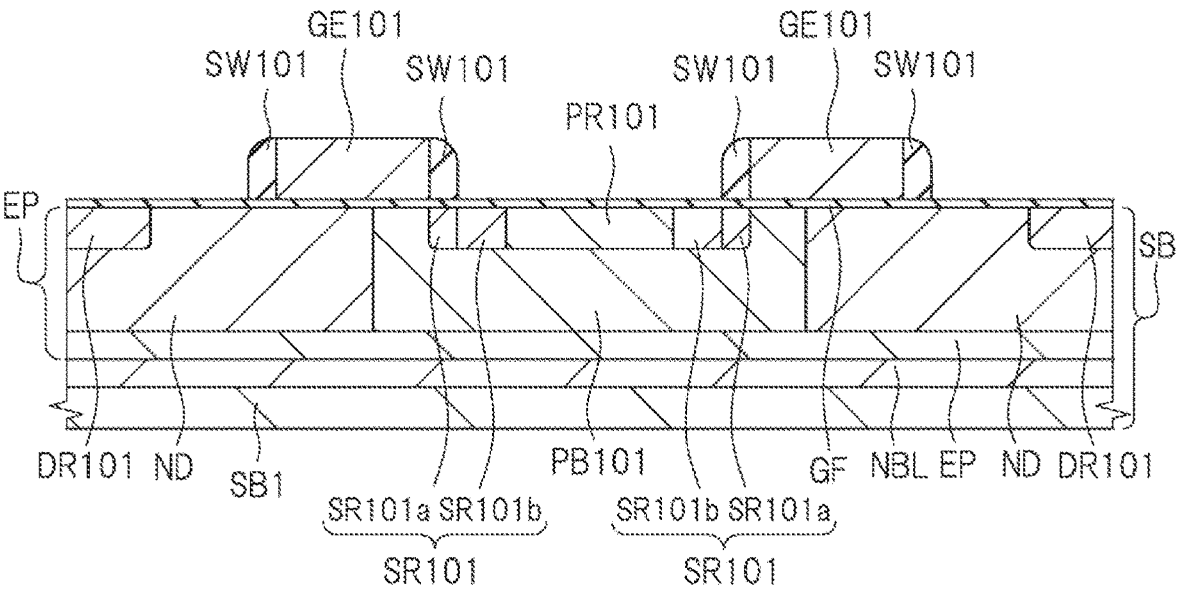
FIG. 29 is a cross-sectional view of the main portion during the manufacturing process of the semiconductor device following FIG. 28.

Next, as shown in FIG. 28, the p-type semiconductor region PR101 is formed in the epitaxial layer EP of the semiconductor substrate SB by implanting p-type impurities using the photoresist pattern RP104 as an ion implantation prevention mask. Thereafter, as shown in FIG. 29, the photoresist pattern RP104 is removed.

Next, activation annealing, which is a heat treatment for activating impurities implanted (implantation) so far, is performed.

Figure 30:
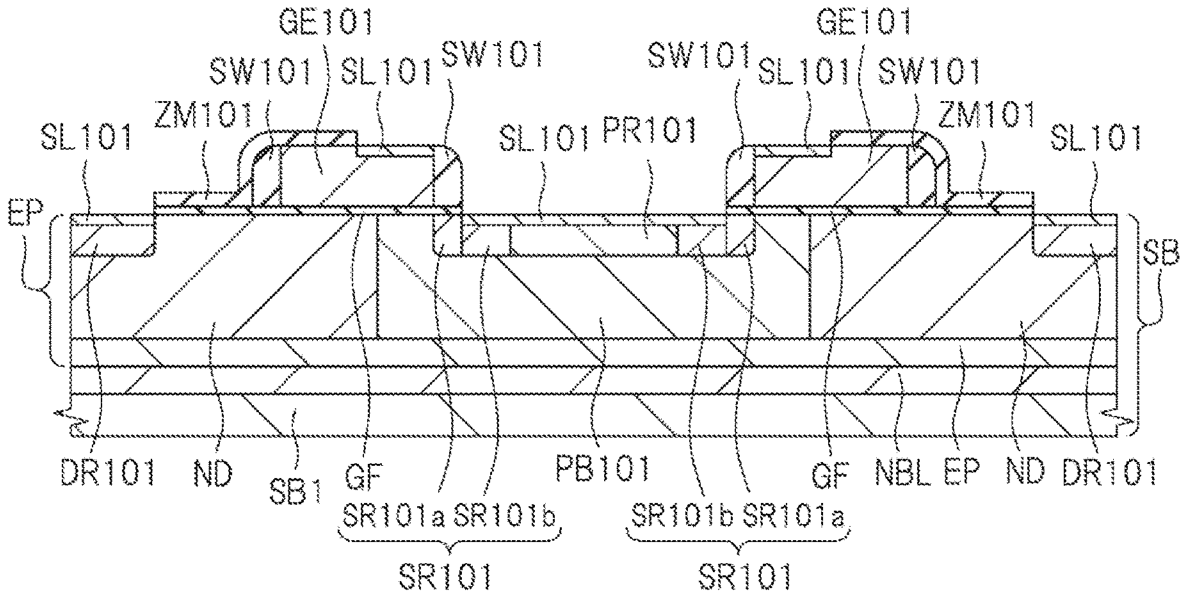
FIG. 30 is a cross-sectional view of the main portion during the manufacturing process of the semiconductor device following FIG. 29.

Next, as shown in FIG. 30, a metal silicide layer SL101 is formed by using a Salicide technique after a dielectric film (silicide block film) ZM for preventing the metal silicide layer SL101 from being formed.

Thereafter, as shown in FIG. 21, the interlayer dielectric film IL is formed on the main surface of semiconductor substrate SB, the contact hole is formed in the interlayer dielectric film IL, the plug PG101 is formed in the contact hole, and wirings M101 is formed on the interlayer dielectric film IL101 in which the plug PG101 is buried.

Figure 31:
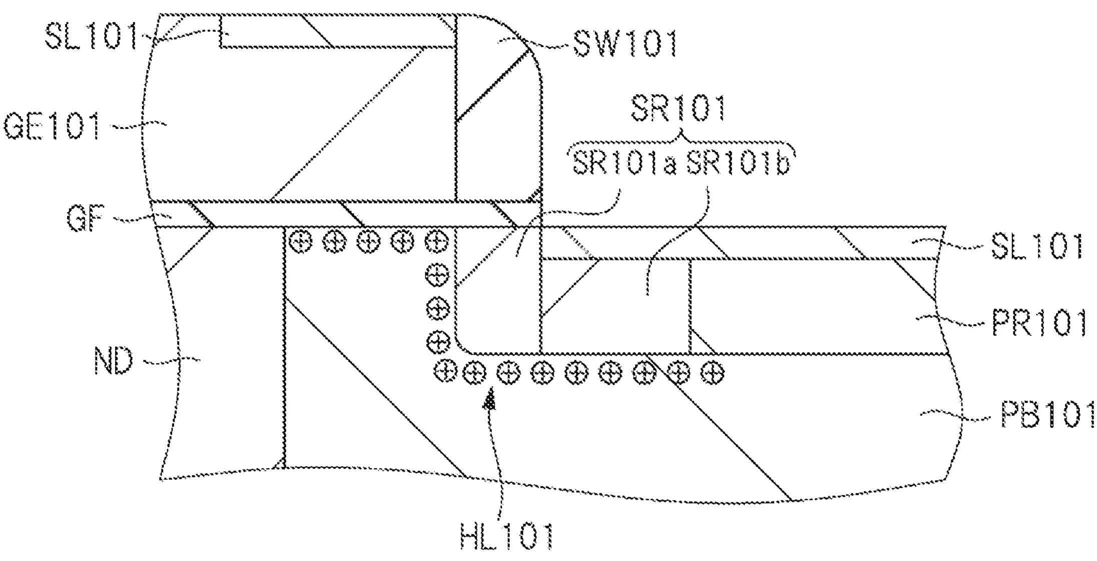
FIG. 31 is a cross-sectional view of the main portion of the semiconductor device according to the examined example.

FIG. 31 is a cross-sectional view of the main portion of the semiconductor device according to the examined example and is an enlarged view of a portion of FIG. 21. According to a study by the present inventors, it is found out that the following problem occurs in the examined example.

When a voltage equal to or higher than the threshold voltage is applied to the gate electrode GE101, a channel (n-type inversion layer) is formed on the p-type semiconductor region PB101 located under the gate electrode GE101. When the channel is formed, the n-type source region SR101 and the n-type drain region DR101 conduct via the channel and the n-type semiconductor region ND.

When a current flows between the n-type source region SR101 and the n-type drain region DR101, holes HL101 are easily accumulated at a position schematically shown in FIG. 31. That is, from the channel forming region in upper portion of the p-type semiconductor region PB101 to the vicinity of PN junction surface between the n-type source region SR101 and the p-type semiconductor region PB101, the holes HL101 are likely to be accumulated. The increase of the accumulation of holes in the vicinity of PN junction surface between the n-type source region SR101 and the p-type semiconductor region PB101 is likely to cause the potential difference between the n-type source region SR101 and the p-type semiconductor region PB101, and the increase acts to increase the potential difference. Consequently, when a large current flows between the n-type source region SR101 and the n-type drain region DR101, the parasitic bipolar transistor is likely to operate, and the on-state breakdown voltage of LDMOSFET decreases. This leads to a decrease in the performance of the semiconductor device. In order to improve the performance of the semiconductor device, it is desired to prevent the parasitic bipolar transistor from operating as much as possible and to improve the on-state breakdown voltage of LDMOSFET.

In the examined example, it is difficult to suppress the width (dimension) L101 (refer to FIGS. 21 and 28) of the p-type semiconductor region PR101 in the gate length direction (X direction). This is disadvantage in miniaturization of the semiconductor device. The reason why it is difficult to suppress the width L101 of the p-type semiconductor region PR101 is described below.

Figure 23:
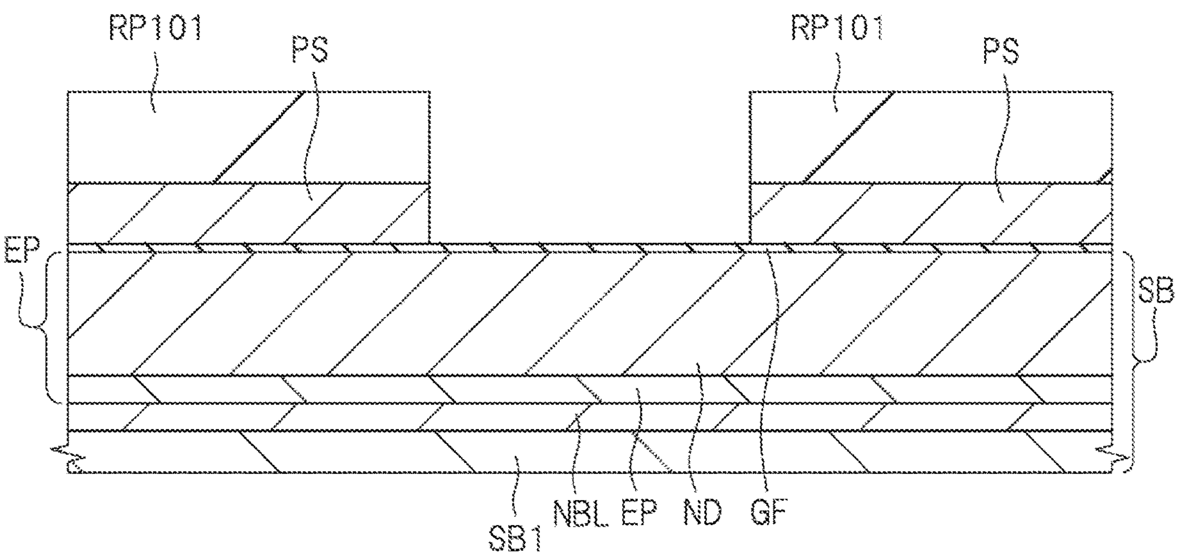
FIG. 23 is a cross-sectional view of the main portion during a manufacturing process of the semiconductor device according to the examined example.

In the examined example, the low-concentration semiconductor region SR101*a* for the n-type source region SR101 is formed in the step of FIG. 23, the high-concentration semiconductor region SR101*b* for the n-type source region SR101 is formed in the step of FIG. 27, and the p-type semiconductor region PR101 is formed in the step of FIG. 28. When the high-concentration semiconductor region SR101*b* for the source region SR101 is formed in the step of FIG. 27, the photoresist pattern RP103 is used as a mask, but the photoresist pattern RP103 includes the photoresist pattern RP103*a* covering the region where the p-type semiconductor region PR101 is to be formed. The photoresist pattern RP103*a* is provided in order to prevent the n-type impurities from being implanted into the region where the p-type semiconductor region PR101 is to be formed in the ion implantation step of forming the high-concentration semiconductor region SR101*b* for the source region SR101. The width (dimension) L102 of the photoresist pattern RP103*a* in the gate length direction (X direction) (see FIG. 27) is set to be substantially the same as the width L101 of the p-type semiconductor region PR101 formed in the step of FIG. 28.

Here, in the step of FIG. 27, it is assumed that the photoresist pattern RP103 does not have the photoresist pattern RP103*a*. In the ion implantation step of forming the high-concentration semiconductor region SR101*b* for the source region SR101, the n-type impurities are also implanted at a high concentration in the region where the p-type semiconductor region PR101 is to be formed. When the n-type impurities are implanted at a high concentration in the region where the p-type semiconductor region PR101 is to be formed, it is difficult to control the effective p-type impurity concentration of the formed p-type semiconductor region PR101 when the p-type semiconductor region PR101 is formed by the ion implantation of the p-type impurities in the step of FIG. 28, and it is difficult to form the p-type semiconductor region PR101 having a desired impurity concentration. Therefore, in the step of FIG. 27, the photoresist pattern RP103 needs to have the photoresist pattern RP103*a* for preventing the n-type impurities from being implanted into the region where the p-type semiconductor region PR101 is to be formed.

However, there are limitations in reducing the width L102 of the photoresist pattern RP103*a*. This is because the photoresist pattern RP103*a* becomes a pattern having a small width when the width L102 of the photoresist pattern RP103*a* is reduced, and thus the photoresist pattern RP103*a* tends to fall down in the middle of step. Therefore, the width L102 of the photoresist pattern RP103*a* needs to be increased to some extent, and consequently, the width L101 of the p-type semiconductor region PR101 needs to be increased to some extent. Therefore, it is difficult to suppress the width L101 of the p-type semiconductor region PR101.

Further, it is assumed that the high-concentration semiconductor region SR101*b* is not formed. Here, the photoresist pattern RP103 does not have the photoresist pattern RP103*a* because the photoresist pattern RP103 can cover the entire low-concentration semiconductor region SR101*a*. However, in this case, the source region SR101 is formed of the low-concentration semiconductor region SR101*a*, and therefore, the n-type impurity concentration of the low-concentration semiconductor region SR101*a* needs to be set to a high-n-type impurity concentration suitable for the source region SR101. That is, when the low-concentration semiconductor region SR101*a* is formed by ion-implantation using the photoresist pattern RP101 in the step of FIG. 24, the n-type impurity concentration of the low-concentration semiconductor region SR101*a* needs to be set as high as that of the high-concentration semiconductor region SR101*b*. In this case, in order to prevent the n-type impurities from being implanted into the region where the p-type semiconductor region PR101 is to be formed, the photoresist pattern RP101 needs to have the photoresist pattern RP103*a* covering the region where the p-type semiconductor region PR101 is to be formed. Since the width L102 of the photoresist pattern RP103*a* of the photoresist pattern RP101 needs to be increased to some extent, it is difficult to suppress the width L101 of the p-type semiconductor region PR101.

Main Features and Effects

FIG. 32 is a cross-sectional view of the main portion of the semiconductor device according to the present embodiment and is an enlarged view of a portion of FIG. 1.

When a current flows between the n-type source region SR and the n-type drain region DR, holes HL are easily accumulated at the position schematically shown in FIG. 32. That is, the holes HL are likely to be accumulated from the channel forming region in upper portion of the p-type semiconductor region PB to the p-type semiconductor region PR under the recessed portion KB.

In the present embodiment, the recessed portion KB is provided in the semiconductor substrate SB and the p-type semiconductor region PR is formed under the recessed portion KB. Therefore, the n-type source region SR and the p-type semiconductor region PR are adjacent to each other in plan view, but are shifted from each other in the thickness direction of the semiconductor substrate SB, and the p-type semiconductor region PR is formed at a position deeper than the n-type source region SR. Reflecting this, the accumulation position of the holes HL is some distance away from PN junction surface between the n-type source region SR and the p-type semiconductor region PB, it is possible to suppress the accumulation of holes in the vicinity of PN junction surface between the n-type source region SR and the p-type semiconductor region PB. That is, in the case of the examined example (FIG. 31), the accumulation amount of holes is increased in the vicinity of PN junction surface between the n-type source region SR101 and the p-type semiconductor region PB101, but in the case of the present embodiment (FIG. 32), the accumulation amount of holes in the vicinity of PN junction surface between the n-type source region SR and the p-type semiconductor region PB can be suppressed.

The increase of the accumulation of holes in the vicinity of PN junction surface between the n-type source region SR and the p-type semiconductor region PB is likely to cause the potential difference between the n-type source region SR and the p-type semiconductor region PB, and the increase acts to increase the potential difference. In the present embodiment, since the recessed portion KB is provided in the semiconductor substrate SB and the p-type semiconductor region KB is formed under the recessed portion PR, it is possible to suppress the accumulation of holes in the vicinity of PN junction surface between the n-type source region SR and the n-type drain region DR when a large current flows between the n-type source region SR and the p-type semiconductor region PB. Consequently, when a large current flows between the n-type source region SR and the n-type drain region DR, the potential difference between the n-type source region SR and the p-type semiconductor region PB is suppressed, and the parasitic bipolar transistor can be prevented from operating. Therefore, the on-state breakdown voltage of LDMOSFET can be improved. Therefore, the performance of the semiconductor device can be improved.

Also in the present embodiment, by providing the recessed portion KB in the semiconductor substrate SB and forming the p-type semiconductor region PR under the recessed portion KB, the width (dimension) L1 (refer to FIG. 32) of the p-type semiconductor region PR in the gate length direction (X direction) can be suppressed so as to be small. Therefore, it is possible to reduce the size (area reduction) of the semiconductor device. As the cell size decreases, the resistance of the semiconductor can be reduced.

The reason why the width L1 of the p-type semiconductor region PR can be suppressed will be described below.

As described above, in the semiconductor device of the present embodiment, the recessed portion KB is formed in the semiconductor substrate SB, and the p-type semiconductor region PR is formed under the recessed portion KB. Reflecting this, the manufacturing process of the semiconductor device according to the present embodiment includes a step of forming the n-type source region in the semiconductor substrate SB using an ion implantation method, a step of forming the recessed portion KB by etching the semiconductor substrate SB so as to penetrate through the n-type source region SR, and a step of forming the p-type semiconductor region PR by using an ion implantation method under the recessed portion KB and in the semiconductor substrate SB.

By etching the semiconductor substrate SB after the n-type source region SR is ion-implanted into the semiconductor substrate SB (see FIG. 9), the recessed portion KB is formed (see FIG. 11) is formed. Since the recessed portion KB is formed so as to penetrate through the n-type source region SR, the recessed portion KB is formed by removing a part of the n-type source region SR by etching. Therefore, when the recessed portion KB is formed, the region under the recessed portion KB in the semiconductor substrate SB is a region in which the n-type impurities are hardly implanted when the n-type source region SR is formed by ion-implantation. Then, when the p-type semiconductor region PR is formed by ion implantation under the recessed portion KB (see FIG. 15), the p-type semiconductor region PR can be formed in a region where almost no n-type impurities is implanted when the n-type source region SR is formed by ion implantation. Thus, the n-type impurity concentration of the n-type source region SR can be set to a suitable impurity concentration as the source region of LDMOSFET, and the n-type impurities implanted when forming the n-type source region SR can be suppressed or prevented from affecting the effective impurity concentration of the p-type semiconductor region PR. Therefore, the effective p-type impurity concentration of the formed p-type semiconductor region PR101 can be accurately controlled, and the p-type semiconductor region PR101 having a desired impurity concentration can be accurately formed.

In the present embodiment, after the n-type source region SR is formed by ion implantation, the recessed portion KB is formed by etching, and thereafter, the p-type semiconductor region PR is formed by ion implantation under the recessed portion KB, so that the photoresist pattern RP1 used for forming the n-type source region SR by ion implantation does not require to cover the region where the p-type semiconductor region PR is to be formed (see FIG. 8). Therefore, ion-implantation for forming the n-type source region SR can be performed while the region where the p-type semiconductor region PR is to be formed is exposed from the photoresist pattern RP1 without being covered with the photoresist pattern RP1. Therefore, the photoresist pattern RP1 used in forming the n-type source region SR does not have a photoresist pattern corresponding to the photoresist pattern RP103*a* (i.e., a photoresist pattern covering the region where the p-type semiconductor region PR is to be formed).

In addition, the photoresist pattern RP2 used in forming the recessed portion KB has the opening portion OP1 exposing the region where the recessed portion KB is to be formed, and the recessed portion KB can be formed by etching the semiconductor substrate SB at the bottom portion of the opening portion OP1 of the photoresist pattern RP2. Further, the photoresist pattern RP4 used in forming the p-type semiconductor region PR has the opening portion OP2 exposing the region where the p-type semiconductor region PR is to be formed, and the p-type semiconductor region PR can be formed by ion-implanting the p-type impurities into the semiconductor substrate SB through the opening portion OP2 of the photoresist pattern RP2. Even if the width (dimension) L2 (refer to FIG. of the opening portion OP1 in the gate length direction (X direction) is reduced, the photoresist pattern RP2 does not fall down in the middle of step. Further, even if the width (dimension) L4 (refer to FIG. 15) of the opening portion OP2 in the gate length direction (X direction) is reduced, the photoresist pattern RP4 is not stably damaged, and the photoresist pattern RP4 does not fall down in the middle of step. Therefore, the width L2 of the opening portion OP1 and the width L4 of the opening portion OP2 can be reduced, so that the width (dimension) L3 of the recessed portion KB in the gate length direction (X direction) (see FIG. 11) can be reduced, and the width L1 of the p-type semiconductor region PR in the gate length direction (X direction) (see FIG. 32) can be reduced. The width L102 of the photoresist pattern RP103*a* needs to increase to some extent, which makes it difficult to suppress the width L101 of the p-type semiconductor region PR101, but the present embodiment does not need to have such a limitation.

As described above, in the present embodiment, the width L1 of the p-type semiconductor region PR in the gate length direction can be suppressed to be small, so that the semiconductor device can be downsized (reduced in area).

For example, in the case of the examined example (FIGS. 21 to 31), the width L101 of the p-type semiconductor region PR101 in the gate length direction is, for example, about 0.5 μm, but in the case of the present embodiment (FIGS. 1 to 20 and 32), the width L3 of the recessed portion KB and the width L1 of the p-type semiconductor region PR in the gate length direction can be, for example, about 0.2 to 0.3 μm. The n-type impurity concentration of the n-type source region SR can be, for example, about 1E19 to $1E21/cm^3$.

Further, since the plurality of plugs PGP, PGS can be arranged in a straight line in the gate width direction, the plugs PGP, PGS can be efficiently arranged. Therefore, the semiconductor device can be reduced in size in the gate length direction and the semiconductor device can be reduced in area. Further, the n-type source region SR can be arranged over the entire width with respect to the gate width of the gate electrode GE because the p-type semiconductor region PR, the p-type semiconductor region PB, and the plug PGP are included in the n-type source region SR. Therefore, a large effective gate width region ratio can be secured.

Second Embodiment

Figure 33:
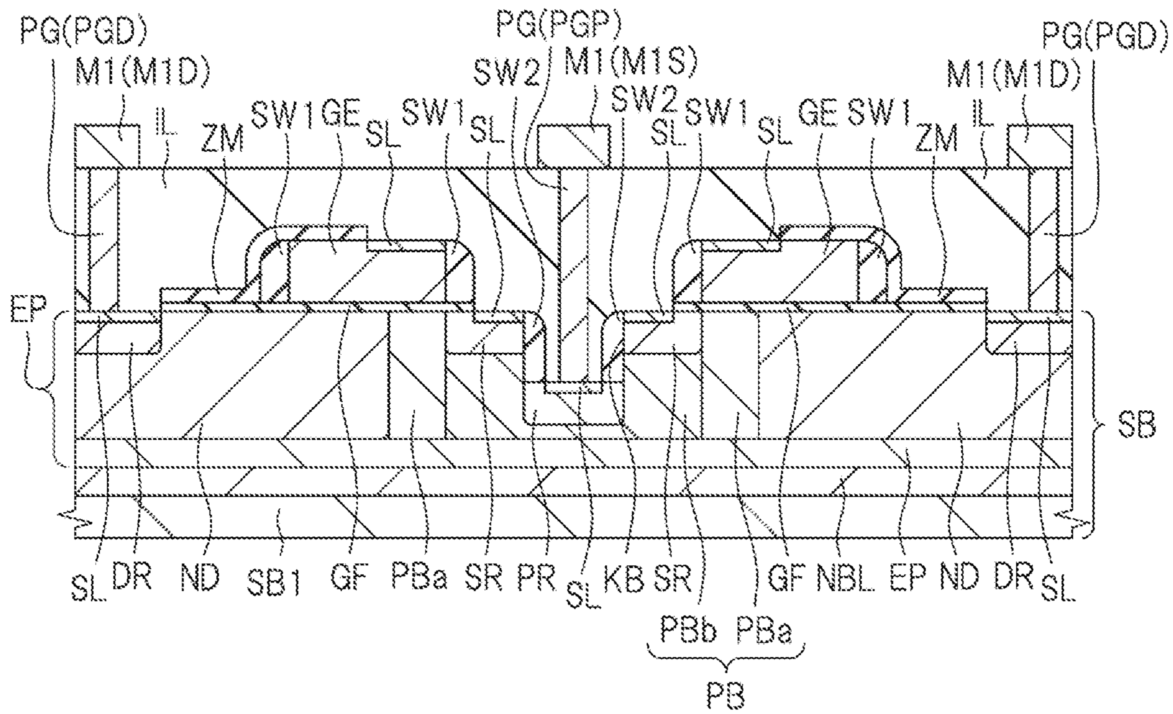
FIG. 33 is a cross-sectional view of the main portion of a semiconductor device according to another embodiment.
Figure 34:
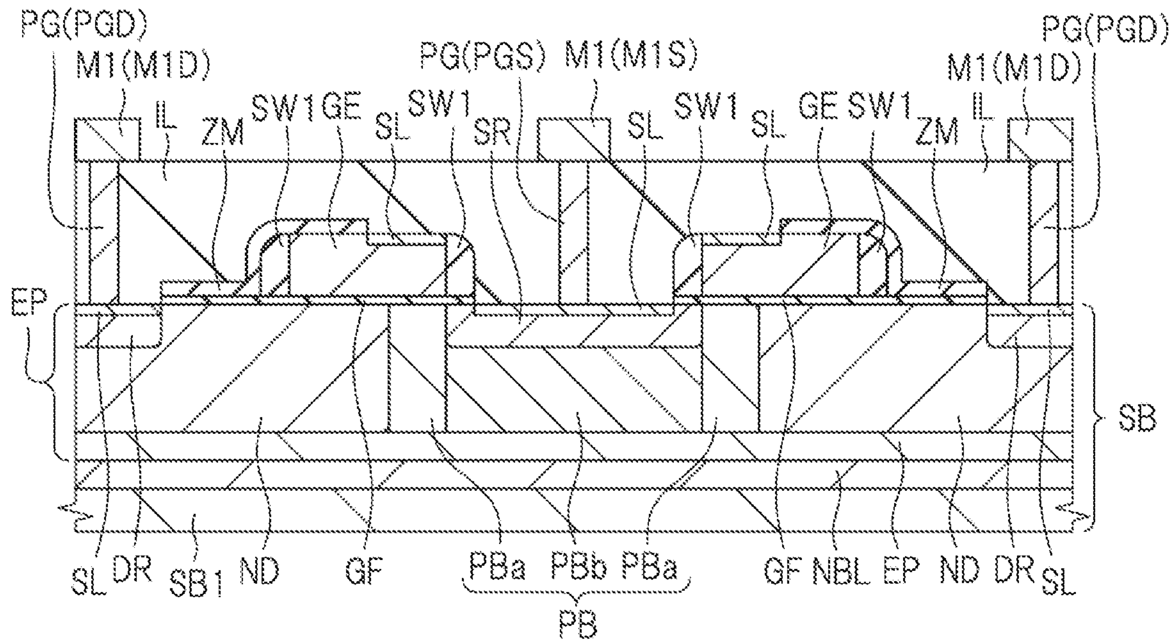
FIG. 34 is a cross-sectional view of the main portion of the semiconductor device according to another embodiment.

FIG. 33 and FIG. 34 are cross-sectional views of a main portion of a semiconductor device according to the second embodiment. FIG. 33 shows a cross section corresponding to FIG. 1, and FIG. 34 shows a cross section corresponding to FIG. 2.

The semiconductor device of the second embodiment shown in FIGS. 33 and 34 is different from the semiconductor device of the first embodiment (FIGS. 1 to 3) in the following points.

That is, in the second embodiment, the p-type semiconductor region PB includes a p-type semiconductor region PBa and a p-type semiconductor region PBb having an impurity concentration (p-type impurity concentration) higher than that of the p-type semiconductor region PBa. The p-type semiconductor region PR formed under the recessed portion KB is surrounded by the p-type semiconductor region PBb. That is, the bottom surface and the side surface of the p-type semiconductor region PR are covered with the p-type semiconductor region PBb. The p-type semiconductor region PR has a higher impurity concentration (p-type impurity concentration) than the p-type semiconductor region PBb. The p-type semiconductor region PBb is located under the p-type semiconductor region PR and under the n-type source region SR. The p-type semiconductor region PBa is adjacent to the p-type semiconductor region PBb (more specifically, adjacent to in X direction), and the channel of LDMOSFET is formed in the p-type semiconductor region PBa. That is, the channel forming region of LDMOSFET is located in the p-type semiconductor region PBa.

Otherwise, the semiconductor device of the second embodiment is substantially the same as the first embodiment described above, and therefore, repeated explanation thereof will be omitted here.

Further, the manufacturing process of the semiconductor device of the second embodiment is different from the manufacturing process of the semiconductor device of the first embodiment in the p-type semiconductor region PB forming step of FIG. 9. That is, in the second embodiment, the p-type semiconductor region PB forming step includes a step of forming the p-type semiconductor region PBa by ion implantation of the p-type impurities and a step of forming the p-type semiconductor region PBb by ion implantation of the p-type impurities, and any of the steps can be performed using the photoresist pattern RP1 as the ion implantation prevention mask. The ion implantation for forming the p-type semiconductor region PBb has a deeper implantation depth and a larger dose amount than the ion implantation for forming the p-type semiconductor region PBa. Although oblique ion implantation is used for ion implantation for forming the p-type semiconductor region PBa, the ion implantation for forming the p-type semiconductor region PBb may be orthogonal ion implantation. In the p-type semiconductor region PR forming step, the p-type semiconductor region PR is formed in the p-type semiconductor region PBb.

In the second embodiment, the p-type semiconductor region PB is configured by the p-type semiconductor region PBb having a high impurity concentration and surrounding the p-type semiconductor region PR, and the p-type semiconductor region PBa which is adjacent to the p-type semiconductor region PBb and having a p-type impurity concentration lower than that of the p-type semiconductor region PBb. As a result, the p-type semiconductor region PR having a high impurity-concentration is easily formed under the recessed portion KB. In addition, the p-type semiconductor region PR and the p-type semiconductor region PB can be electrically connected with lower resistance. Further, because the p-type semiconductor region PBa can be set independently from the impurity concentration of the p-type semiconductor region PBb and the channel of LDMOSFET is formed in the p-type semiconductor region PBa, even if the impurity concentration of the p-type semiconductor region PBb is increased, the characteristics of LDMOSFET is not lowered.

The invention made by the present inventor has been described above in detail based on the embodiment, but the present invention is not limited to the embodiment described above, and it is needless to say that various modifications can be made without departing from the gist thereof.

APPENDIX 1

A method of manufacturing a semiconductor device includes; (a) preparing a semiconductor substrate; (b) forming a conductive film of a gate electrode of a MISFET on the semiconductor substrate via a gate dielectric film; (c) after the (b), forming a first resist pattern on the conductive film; (d) after the (c), etching the conductive film using the first resist pattern as an etching mask to form a side surface of the gate electrode on source-side; (e) after the (d), performing an ion-implantation using the first resist pattern as a mask to form a source region of a first conductivity type of the MISFET in the semiconductor substrate; (f) after the (e), removing the first resist pattern; (g) after the (f), forming a second resist pattern on the semiconductor substrate so as to cover a part of the conductive film; wherein the second resist pattern has a first opening portion included in the source region in plan view; (h) after the (g), etching the semiconductor substrate using the second resist pattern as an etching mask to form a recessed portion so as to penetrate through the source region, and etching the conductive film using the second resist pattern as the etching mask to form the gate electrode by forming a side surface of the gate electrode on drain-side; (i) after the (h), removing the second resist pattern; (j) after the (i), forming a third resist pattern on the semiconductor substrate so as to cover the gate electrode; (k) after the (j), forming a drain region of the first conductivity type of the MISFET in the semiconductor substrate by ion-implantation using the third resist pattern as a mask; (l) after the (k), removing the third resist pattern; (m) after the (i), forming a fourth resist pattern on the semiconductor substrate so as to cover the gate electrode; wherein the fourth resist pattern has a second opening portion at a location overlapping with the recessed portion in plan view; (n) after the (m), forming a first semiconductor region of a second conductivity type under the recessed portion by ion-implantation using the fourth resist pattern as a mask, the second conductivity type being opposite to the first conductivity type; and (o) after the (n), removing the fourth resist pattern.

What is claimed is:

1. A semiconductor device comprising:

a semiconductor substrate;

a source region of a first conductivity type of a MISFET and a drain region of the first conductivity type of the MISFET, the source region and the drain region being formed spaced apart from each other in the semiconductor substrate;

a gate electrode of the MISFET, the gate electrode being formed on the semiconductor substrate between the source region and the drain region via a gate dielectric film;

a recessed portion formed on the semiconductor substrate and penetrating the source region;

at least one first semiconductor region of a second conductivity type formed under the recessed portion, the second conductivity type being opposite the first conductivity type;

a second semiconductor region of the second conductivity type formed in the semiconductor substrate so as to surround the source region and the at least one first semiconductor region;

an interlayer dielectric layer provided on the semiconductor substrate;

a first contact plug electrically connected to the at least one first semiconductor region; and sidewall dielectric films formed on side surfaces of the recessed portion, wherein the first contact plug penetrates through the interlayer dielectric layer, passes through between the sidewall dielectric films and reaches an upper surface of the at least one first semiconductor region.

2. The semiconductor device according to claim 1, wherein the second semiconductor region is in contact with a bottom surface of the at least one first semiconductor region and a side surface of the at least one first semiconductor region, and is in contact with a bottom surface of the source region and a side surface of the source region opposite to a side of the recessed portion.

3. The semiconductor device according to claim 1, wherein, in plan view, the recessed portion is surrounded by the source region.

4. The semiconductor device according to claim 3, wherein, in a gate width direction of the gate electrode, a width of the source region is equal to a width of the gate electrode.

5. The semiconductor device according to claim 1, wherein an upper surface of the at least one first semiconductor region is located below a bottom surface of the source region in the semiconductor substrate.

6. The semiconductor device according to claim 5, wherein, in a gate length direction of the gate electrode, a length of the at least one first semiconductor region is larger than a length of the recessed portion.

7. The semiconductor device according to claim 1, wherein, in plan view, the at least one first semiconductor region is arranged in an island shape in the second semiconductor region.

8. The semiconductor device according to claim 7, wherein the at least one first semiconductor region comprises a plurality of first semiconductor regions formed in the second semiconductor region.

9. The semiconductor device according to claim 1, comprising:

a second contact plug penetrating through the interlayer dielectric layer and electrically connected to the source region, wherein the first contact plug and the second contact plug are arranged on a straight line in a gate width direction of the gate electrode in plan view, and wherein a boundary between the recessed portion and the source region is sandwiched between the first contact plug and the second contact plug.

10. The semiconductor device according to claim 9, wherein a potential supplied from the first contact plug to the at least one first semiconductor region and a potential supplied from the second contact plug to the source region are the same.

11. The semiconductor device according to claim 1, wherein an upper portion of the second semiconductor region between the source region and the drain region is a channel forming region of the MISFET, and wherein an impurity concentration of the at least one first semiconductor region is higher than an impurity concentration of the second semiconductor region.

12. The semiconductor device according to claim 1, comprising:

a third semiconductor region of the first conductivity type interposed between the at least one first semiconductor region and the drain region in a gate length direction of the gate electrode, wherein an impurity concentration of the third semiconductor region is lower than an impurity concentration of the drain region.

13. The semiconductor device according to claim 11, wherein the second semiconductor region includes:

a fourth semiconductor region of the second conductivity type surrounding the at least one first semiconductor region; and a fifth semiconductor region of the second conductivity type adjacent to the fourth semiconductor region, wherein an impurity concentration of the fourth semiconductor region is higher than an impurity concentration of the fifth semiconductor region, wherein the channel forming region is located in the fifth semiconductor region.

14. The semiconductor device according to claim 1, wherein at least one pair of the recessed portion and the at least one first semiconductor region comprises a plurality of pairs of recessed portions and first semiconductor regions formed in the semiconductor substrate, and wherein the plurality of pairs are arranged spaced apart from each other in a gate width direction of the gate electrode.

* * * * *